United States Patent [19]

Kobayashi et al.

[11] Patent Number: 4,767,494

[45] Date of Patent: Aug. 30, 1988

[54] PREPARATION PROCESS OF COMPOUND SEMICONDUCTOR

[75] Inventors: Naoki Kobayashi, Iruma; Toshiki Makimoto, Tokorozawa; Yoshiji Horikoshi, Akishima, all of Japan

[73] Assignee: Nippon Telegraph & Telephone Corporation, Tokyo, Japan

[21] Appl. No.: 909,287

[22] Filed: Sep. 19, 1986

[30] Foreign Application Priority Data

Jul. 4, 1986 [JP] Japan .................. 61-156260
Jul. 29, 1986 [JP] Japan .................. 61-176611

[51] Int. Cl.$^4$ .......................................... C30B 25/02
[52] U.S. Cl. ................................... 156/606; 156/613; 437/110
[58] Field of Search ............... 156/606, 610, 612, 613, 156/DIG. 70, DIG. 89, DIG. 113; 148/DIG. 72, DIG. 160; 427/51, 86; 437/110

[56] References Cited

U.S. PATENT DOCUMENTS

| | | | |
|---|---|---|---|
| 4,058,430 | 11/1977 | Suntola et al. | |
| 4,147,571 | 4/1979 | Stringfellow et al. | 156/610 |
| 4,193,835 | 3/1980 | Inoue et al. | 156/606 |
| 4,404,265 | 9/1983 | Manasevit | 156/610 |
| 4,422,888 | 12/1983 | Stutius | 156/606 |
| 4,488,914 | 12/1984 | Quinlan et al. | 156/610 |
| 4,566,918 | 1/1986 | Irvine et al. | 156/613 |
| 4,568,397 | 2/1986 | Hoke et al. | 156/610 |

FOREIGN PATENT DOCUMENTS

87/03740  6/1987  PCT Int'l Appl. .................. 437/10

OTHER PUBLICATIONS

Biefeld, R., "The Preparation of $InAs_{1-x}Sb_x$ Alloys and Strained-Layer Superlattices by MOCVD", J. Crys. Growth 77 (Sep. 86), 392–399, Apr. Conference, 86.

Ohno et al., "Free Carrier Profile Synthesis in MOCVD Grown GaAs by 'Atomic-Plane' Doping", Jap. J. Appl. Phys., vol. 23, No. 6, 1984, pp. L369–L370.

Kobayashi et al., "Flow-Rate Modulation Epitaxy of GaAs", Japanese Journal of Applied Physics, vol. 24, No. 12, Dec. 1985, pp. L962–L964.

Oyo Buturi, vol. 53, No. 6 (1984), pp. 516–520.

Sakamoto et al., "Phase-Locked Epitaxy Using Rheed Intensity Oscillation", Jap. J. of App. Physics, vol. 23, No. 9 (1984), pp. L657–L659.

L. L. Chang et al, "The Growth of a GaAs-GaAlAs Superlattice", J. Vac. Sci. Technol., vol. 10, No. 1, 1973, pp. 11–16.

M. Ahonen et al, "A Study of ZnTe Films Grown . . . ", Thin Solid Films, 65, 1980, 301–307.

Jun-ichi Nishizawa et al, "Molecular Layer Epitaxy", J. Electrochem. Soc., Solid State Science and Technology, 1985, pp. 1197–2000.

(List continued on next page.)

Primary Examiner—John Doll
Assistant Examiner—R. Bruce Breneman
Attorney, Agent, or Firm—Spencer & Frank

[57] ABSTRACT

A compound semiconductor thin film is formed by growing a plurality of molecular layers one over another. According to the present invention, while a carrier gas and a small quantity of hydride containing an element in Group V or VI are normally flowed, an organometallic compound which is diluted with hydrogen and which contains an element in Group III or II and a hydride which is diluted with hydrogen and which contains an element in Group V or VI are alternately introduced over a substrate so that an atomic layer of an element in Group III or II and an atomic layer of an element in Group V or VI are alternately grown over the substrate. According to this method, grown layers having a high degree of purity can be obtained. A portion such as a Ga-Ga two-layer structure formed in the growth of a surface of an element in Group III or II can easily be eliminated by the introduction of a hydrogen halide so that the surface defects and deep levels are significantly decreased and perfect crystals can be obtained. According to the present invention, a high-concentration doping of a III-V compound semiconductor becomes possible. The method of the present invention is advantageous in the fabrication of high-speed FETs and multi-quantum-well lasers using compound semiconductors.

26 Claims, 41 Drawing Sheets

OTHER PUBLICATIONS

J. P. Duchemin et al, "A New Method for Growing GaAs Epilayers . . . ", J. Electrochem. Soc., Electrochemical Science and Technology, Jul. 1979, pp. 1134–1142.

S. J. Bass et al, "Controlled Doping of Gallium Arsenide . . . ", Inst. Phys. Conf., Ser. No. 33b, 1977, Chapter 1, pp. 1–10.

V. Aebi et al, "Characterization of Organometallic VPE Grown GaAs . . . ", Journal of Crystal Growth 55, 1981, pp. 517–525.

Shigehiko Sasa et al, "Si Atomic-Planar-Doping in GaAs Made . . . ", Japanese Journal of Applied Physics, vol. 24, No. 8, Aug. 1985, pp. L602–L604.

PREPARATION PROCESS OF COMPOUND SEMICONDUCTOR

BACKGROUND OF THE INVENTION

1. Field of the Invention

The present invention relates to a process for preparing compound semiconductor films and especially III-V or II-VI compound semiconductor films.

2. Description of the Prior Art

In order to grow compound semiconductor films over the surfaces of substrates, methods have been devised and demonstrated including the metallorganic Chemical Vapor Deposition (MOCVD) method, molecular beam epitaxy (MBE), atomic layer epitaxy (ALE), molecular layer epitaxy (MLE) and so on.

The MOCVD method is disclosed in detail by, for instance, H. M. Manasevit et al. (J. Electrochem. Soc:. 120 (1973), 569). According to this method, as shown in FIG. 1, organometallic compounds and hydride compounds are transported by a hydrogen carrier gas over the heated surface of a substrate so that a compound semiconductor layer is formed over the surface of the substrate by thermal decompositions. For instance, in the case of GaAs which is one of the III-V compound semiconductors, trimethyl gallium $(CH_3)_3Ga$ which is an organometallic compound of Ga and arsine which is a hydride compound of As are introduced over the surface of a heated substrate 1 disposed in a reaction vessel 3, decomposed and diffused into a velocity boundary layer 2 defined adjacent to the substrate 1 so that completely decomposed Ga and As atoms adhere to the surface of the substrate 1, thereby growing a GaAs crystal. While trimethyl gallium (TMG) is almost not decomposed outside of the boundary layer 2, it is almost 100% decomposed over the surface of the substrate 1 so that a trimethyl gallium concentration gradient exists in the boundary layer 2. The growth rate is approximately in proportion to the concentration gradient, so that the growth rate becomes higher at the upstream side at which the boundary layer 2 is thin and the growth rate is gradually decreased downstream as shown in FIG. 2. Thus, the most serious defect of the MOCVD method is that the thickness of the grown layer over the surface of a substrate is not uniform. Meanwhile, research and development of semiconductor devices having an extremely fine structure such as a quantum well structure, a superlattice structure and so on is increasingly being carried out and now demands an epitaxial technique cabable of controlling a single atomic layer. According to the MOCVD mehtod, the growth rate is determined by a raw material supply rate and, as described above, the thickness of the grown layer is not uniform over the whole surface of a substrate so that it is next to impossible to control the single atomic layer over the wide surface of the substrate.

MBE is disclosed in detail by, for instance, L. L. Chang et al. (J. Vac. Sci. Technol. Vo. 10, No. 1, p. 11+ (1973)). Starting material elements, Ga and As in the case of GaAs, are heated in a high vacuum and GaAs crystal depositioned on the surface of a substrate. However, it is also difficult to control the single atomic layer over the wide surface of the substrate because of the non-uniform distribution in space of the molecular beam.

ALE (U.S. Pat. No. 4,058,430: 1977) was proposed by T. Suntola et al. as an improvement to MBE. According to this method, semiconductor elements are alternately supplied in the form of pulses, whereby single atomic layers are alternately formed over the surface of a substrate. This method is advantageous in that the film thickness can be controlled with an accuracy of an atomic layer, but in this method an element having a high vapor pressure tends to be vaporized so that lattice defects result, thus resulting in crystal degradation. T. Suntola et al. presented various reports on the formation of compound thin films by ALE in Thin Solid Films 65 (1980), pp. 301-307; and other publications, but formed compounds are almost all II-VI compound semiconductors and oxides and a III-V compound semiconductor; that is, GaP is disclosed only in one of the EXAMPLES of U.S. Pat. No. 4,058,430. The have not disclosed the formation of GaAs and AlAs. The reason why the application of this method to the formation of III-V compounds is less resides in the fact that the vapor pressure of a Group III atom is extremely low. That is, when Group III atoms are supplied, only adsorption occurs and the adsorption continues after one atomic adsorbed layer is formed.

MLE which can utilize ALE in the formation of III-V compound semiconductor films was proposed by Nishizawa et al. (J. Electrochem. Soc.; SOLID-STATE SCIENCE AND TECHNOLOGY: Vol. 132, No. 5, 1197-1200, 1985). One of the important features of MLE resides in that fact that since in response to the supply of Group III atoms, only adsorption results and the adsorption of only one atomic layer cannot be interrupted, the Group III atoms are supplied in the form of a molecule having a high vapor pressure. According to this method, the adsorption of the material molecules as a single molecular layer, the chemical reactions, removal of reaction products and the film growth proceed in the order named. FIG. 3 is a time chart for the introduction of material elements and FIG. 4 is a schematic view used to explain the growth mechanism. Arsine is introduced over the surface of a heated substrate 1 in a high vacuum and then is exhausted, whereby a single molecular layer of arsine is formed as shown at (a) in FIG. 4. Adsorbed arsine is subjected to thermal decomposition, whereby a single atomic layer of As is formed a shown at (b) in FIG. 4. Thereafter, trimethyl gallium is introduced and decomposed over the surface of the substrate, whereby a single molecular layer of GaAs is formed as shown at (c) and (d) in FIG. 4. The system is exhaused again, thereby discharging excess trimethyl gallium. When the above-described steps are repeated, single atomic layers are grown layer by layer.

However, the above-described method has the following defects:

(1) A single molecular layer of trimethyl gallium is adsorbed over the surface of a substrate and then is subjected to the thermal decomposition, whereby a single Ga atomic layer is formed. However, it is impossible to form a single Ga atomic surface which covers 100% of the surface of the substrate because of the three-dimensional interference and repulstion between trimethyl gallium molecules. As a result, it is impossible in principle to attain the thickness of a single atomic layer by one cycle.

(2) During the growth period, when TMG is introduced or exhausted or when $AsH_3$ is exhausted, there occurs a case in which no As exists in the growth atmosphere. As a result, since As has a high vapor pressure, As leaves the grown layer, leaving vacancies which are filled by impurities. Therefore, a deep impurity level associated with the vacancies of As results. In addition, this method is carried out in a high vacuum so that hydrogen exists so that methyl radicals resulting from the decomposition of trimethyl gallium are not reduced by hydrogen and carbons in the methyl radicals react with the vacancies of As and are incorporated into the growth layer, thus becoming carbon acceptors. In the above-described reports, Nishizawa et al. indicate that the grown layer is of p type with carrier concentration of the order of $10^{19} cm^{-3}$ which proves the contamination of the growth layer with carbon.

(3) Since the decompositon of trimethyl gallium takes a relatively long time and in addition an exhaustion period is needed, one cycle time becomes longer and is on the order of 33 seconds. As a result, in order to obtain the growth layer of one micrometer, more than 30 hours are required, which is not satisfactory in practice.

Meanwhile the process for fabrication of GaAs integrated circuits (ICs) such as GaAs MESFETs demands a technical process capable of forming low-resistance ohmic electrodes. Therefore, a process for introducing a high concentration n+ layer ($>5\times10^{19} cm^{-3}$) is required. To this end, an ion implantation method and an epitaxial growth method have been devised and demonstrated. The ion implantation method is suitable for fabricating fine structures, but has the problems that an introduction of defects is caused by the ion implantation and that an annealing step is further needed.

On the other hand, the metallorganic Chemical Vapor Deposition (MOCVD) method which is included in an epitaxial growth method is excellent because in the case of formation of a III-V compound semiconductor film, the film thickness can be controlled with a relatively high degree of accuracy of on the order of 100 Å and because it is adapted for mass production. This method will be described in connection with the doping of Si into GaAs which is a typical III-V compound semiconductor. An organic gallium compound sucha s trimethyl gallium, arsine ($AsH_3$) which is a hydride of Group V element, silane ($SiH_4$) which is a hydride of a Group IV element and a hydrogen carrier gas are introduced over the surface of a substrate which is heated at high temperatures (650°-750° C.), whereby an n-type GaAs layer doped with Si resulting from thermal decomposition is formed. However, so far there has been no report that the MOCVD method has succeeded in doping more than $5\times10^{18} cm^{-3}$ (Duchemin et al.: J. Electrochem. Soc. 126, 1134 (1979)). The reason resides in the fact that the thermal decompositon of silane is difficult and that, in case of the supply of silane at a high concentration, reactions between the material gases occur so that the growth rate is decreased and the crystal surface is degraded. In like manner, for germane ($GeH_4$) (Duchemin et al.), hydrogen selenide ($H_2Se$) or hydrogen sulfide ($H_2S$) which are hydrides of Group VI elements, n-type doping beyond $5\times10^{18} cm^{-3}$ has been impossible. (Bass and Oliver: International Simposium on GaAs and Related Compounds, St. Louis, 1976, edited by L. F. Eastman (Inst. Phys. Conf. Ser. No. 33b, London 1977), p. 1). The reason is that when supplying a doping gas at a high concentration, it reacts with material molecules in the vapor phase, resulting in a decrease in growth rate and the degradation of surfaces Even for p-type doping with dimethyl zinc and diethyl zinc which are organometallic compounds of Group II elements, it was impossible to dope beyond $10^{19} cm^{-3}$ (Aebi et al.: J. Cryst. Growth 55 (1981) 517). The reason is that when introducing of a doping gas at a high concentration, it reacts with material molecules in the gas phase, resulting in a decrease in growth rate and surface degradation.

As a method for doping impurities only into a single atomic layer and forming a doped III-V compound semiconductor thin film, an atomic layer doping method utilizing the MBE and MOCVD methods may be used. With an example in which GaAs which is a typical III-V compound semiconductor is doped with a single atomic layer of Si, the MBE and MOCVD methods are explained.

According to the MBE method, Ga and As are deposited on the surface of a GaAs substrate which is heated in a high vacuum. Thereafter, the Ga flux is interrupted so that the growth of GaAs crystals is stopped and Si flux is supplied with As flux. Next, Ga and As are deposited again, whereby a GaAs crystal doped with Si in a single atomic layer can be obtained. The maximum surface density available so far by this method is $5\times10^{12} cm^{-2}$ Sasa, S. Muto, K. Kondo, H. Ishikawa and S. Hiyamizu: Jpn. J. Appl. Phys. 24 (1985)L602). However, the supply of As and Si flux must be continued for longer than 300 seconds in order to obtain the high surface density as described above, so that the Si atom doping efficiency is extremely low.

According to the MOCVD method, an organic gallium compound and arsine together with the hydrogen carrier gas are supplied to the surface of a heated GaAs substrate. Next, the supply of the organic gallium compound is interrupted and then arsine and silane are supplied. Thereafter, arsine and the organic gallium compound are supplied again, whereby a GaAs crystal doped with Si in a single atomic layer can be obtained. However, according to this method, the maximum surface density is extremely low and is less than $10^{12} cm^{-2}$ (H. Ohno, E. Ikeda and H. Hasegawa: Jpn. J. Appl. Phys 23 (1984) L369). The reason is that since the growth temperature is as high as 700° C. so that Si atoms are diffused during the crystal growth, the diffusion of Si atoms cannot be interrupted only ofter diffusion into a single atomic layer.

In the case of doping Si into GaAs by both the MBE and MOCVD methods, doping is carried out with excess As atoms; that is, doping is effected always into an As stabilized surface. When Si is doped into a Ga surface by a conventional method, the As beam or the supply of $AsH_3$ is interrupted so that As atoms having a high vapor pressure evaporate from the undersurface of the Ga surface, adversely affecting the surface smoothness of a thin film. As a result, it has been impossible to dope a Ga surface with Si.

Meanwhile, according to the MOCVD method, as reported by T. K. Kuech et al. (Appl. Phys. Lett 44 (1984)986), the $SiH_4$ doping efficiency is significantly dependent upon the growth temperature and the higher the temperature, the higher the carrier concentration becomes. The experimental results show that when a temperature distribution exists in the surface of a substrate, uniform doping in the surface cannot be attained as reported by Kuech et al. In addition, in the case of doping at higher concentration, the growth temperature must be raised. As a result, a profile cannot be distinctly defined due to the diffusion of doping atoms.

As described above, according to the MBE and MOCVD methods, the adsorption power of doping molecules is weak so that elimination results. Consequently, doping concentration is limited.

According to the ALE method proposed by Suntola and the MLE method proposed by Nishizawa et al., the purity of an undoped layer is considerably poor and the investigation of doping was not made so that the present invention is not comparable to the ALE and MLE methods.

SUMMARY OF THE INVENTION

The present invention was made to overcome the above and other problems and defects encountered in the prior art methods. An object of the present invention is to provide a method which can control the growth rate of a single atomic layer over the whole surface of a substrate, can grow high quality compound semiconductor films almost free from lattice defects and impurities, can grow hetero-structures structures having an abrupt compositional change within one atomic layer and can be applied in a variety of fields.

Another object of the present invention is to provide a method for forming compound semiconductor thin films and hetero structures free from defects in surfaces and hetero-boundary surfaces and less deep levels.

A further object of the present invention is to provide a method for forming compound semiconductor thin films which can carry out a high concentration doping into a compound semiconductor at reactively low growth temperatures, can reduce the diffusion of dopants between a doping layer and an undoped layer to a minimum and can decrease defects in crystal surfaces, doping surfaces in crystals and hetero-boundary surfaces.

A yet further object of the present invention is to provide a device for forming not only high quality compound semiconductor thin films in which an epitaxial thin layer which is grown can be controlled in thickness with an accuracy of a single atomic layer thickness and which are free from impurities and surface defects and hetero-structures having an abrupt compositional change within one atomic layer but also compound semiconductor thin films which can be doped at a high concentration.

In the first aspect of the present invention, a preparation process of compound semiconductor thin films in which an organometallic compound containing an element of Group III or II and a hydride containing an element of Group V or VI are transported over a heated substrate and are subjected to thermal decomposition, whereby a III-V or II-VI compound semiconductor is grown over the substrate, comprises:

while normally flowing a carrier gas and a hydride which is diluted to a first concentration at which the hydride does not chemically react with an organometallic compound to produce a III-V or II-VI compound and which contains an element of Group V or VI;

repeating a cycle consisting of a step for introducing over the substrate the hydride which is diluted by the carrier gas to a second concentration higher in hydride than the first concentration;

a step for interrupting the introduction of the hydride at the second concentration;

a step for introducing over the substrate an organometallic compound which is diluted with the carrier gas and which contains an element of Group III or II; and a step for interrupting the introduction of the organometallic compound.

Here, the temperature of the substrate may be between 430° C. and 520° C. The carrier gas may be hydrogen. The first concentration of the hydride may be a molar fraction of less than $4 \times 10^{-5}$.

The second concentration of the hydride may be a molar fraction of higher than $1 \times 10^{-3}$. The diluted concentration of the organometallic compound may be a molar fraction of higher than $1 \times 10^{-4}$.

Two kinds of organometallic compounds containing different metal elements may be introduced as the organometallic compound on the substrate. The organometallic compound may be an organometallic compound containing ethyl radicals.

In the second aspect of the present invention, a preparation process of compound semiconductor thin films in which an organometallic compound containing an element of Group III or II and a hydride containing an element of Group V or VI are introduced over a heated substrate and are subjected to thermal decomposition, whereby a III-V or II-VI compound semiconductor is grown over the substrate, comprises:

while normally flowing a first carrier gas and a hydride which is diluted to a first concentration at which the hydride does not chemically react with the organometallic compound to produce a III-V or II-VI compound and which contains an element of Group V or VI;

repeating a cycle consisting of a step for introducing over the substrate the hydride which is diluted with a second carrier gas at a concentration higher in hydride than the first concentration;

a step for interrupting the introduction of the hydride at the second concentration;

a step for introducing over the substrate an organometallic compound which is diluted with a third carrier gas and which contains an element of Group III or II;

a step for interrupting the introduction of the organometallic compound; and a step for introducing a hydrogen halide which is diluted with a fourth carrier gas.

Here, the first, second, third and fourth carrier gases may consist of hydrogen. The first concentration of the hydride may be a molar fraction of less than $4 \times 10^{-5}$.

The second concentration of the hydride may be a molar fraction of higher than $1 \times 10^{-3}$. The diluted concentration of the organometallic compound may be a molar fraction of higher than $1 \times 10^{-4}$. The concentration of the hydrogen halide may be a molar fraction of higher than $1 \times 10^{-4}$. The hydrogen halide may be hydrogen chloride.

The temperature of the substrate may be maintained at a temperature higher than 400° C. but lower than 600° C. Two kinds of organometallic compounds containing different metal elements may be introduced as the organometallic compound over the substrate. The organometallic compound may be an organometallic compound containing ethyl radicals.

In the third aspect of the present invention, a preparation process of compound semiconductor thin films, comprises:

while normally flowing over a substrate a hydrogen carrier gas and arsine (AsH$_3$) which is diluted to a first concentration at which the arsine does not chemically react with an organometallic compound to produce a III-V compound;

repeating a cycle consisting of a step for introducing over the substrate the arsine which is diluted with the hydrogen carrier gas to a second concentration;

a step for interrupting the introduction of the arsine at the second concentration;

a step for introducing over the substrate an organometallic compound which is diluted with the hydrogen carrier gas and which contains an element in Group III, thereby growing a thin compound semiconductor film over the substrate; and a step for introducing in any step of the cycle silane (SiH$_4$) together with the organometallic compound containing an element of Group III, thereby doping the compound semiconductor.

In the fourth aspect of the present invention, a preparation process of compound semiconductor thin films, comprises:

while introducing over a substrate a hydrogen carrier gas and a hydride which is diluted to a first concentration at which the hydride does not chemically react with an organometallic compound to produce a III-V compound and which contains an element in Group V;

repeating a cycle consisting of a step for introducing over the substrate the hydride which is diluted with the hydrogen carrier gas to a second concentration higher in hydride than the first concentration, a step for interrupting the introduction of the hydride at the second concentration, a step for introducing over the substrate an organometallic compound which is diluted with the hydrogen carrier gas and which contains an element in Group III, a step for interrupting the introduction of the organometallic compound, a step for introducing a hydrogen halide diluted with the hydrogen carrier gas and a step for interrupting the introduction of the hydrogen halide, thereby forming a thin compound semiconductor film over the substrate; and a step for introducing over the substrate the hydrogen gas together with a compound containing an element in Group IV, VI or II thereby doping the compound semiconductor.

Here, the compound containing an element in Group IV, V or II may be simultaneously introduced together with the organometallic compound containing an element in Group III. The compound containing an element in Group IV, VI or II may be introduced immediately after the interruption of the introduction of the Group III element.

The compound containing an element in Group IV, VI or II may be introduced immediately after the interruption of the introduction of the hydride diluted to the second concentration and introduction continued during all of the remaining steps.

The compound containing an element in Group IV may be silane (SiH$_4$). The molar fraction of the silane may be between $10^{-7}$ and $10^{-3}$.

The above and other objects, effects, features and advantages of the present invention will become more apparent from the following description of preferred embodiments thereof taken in conjunction with the accompanying drawings.

DETAILED DESCRIPTION OF PREFERRED EMBODIMENTS

Figure 1:
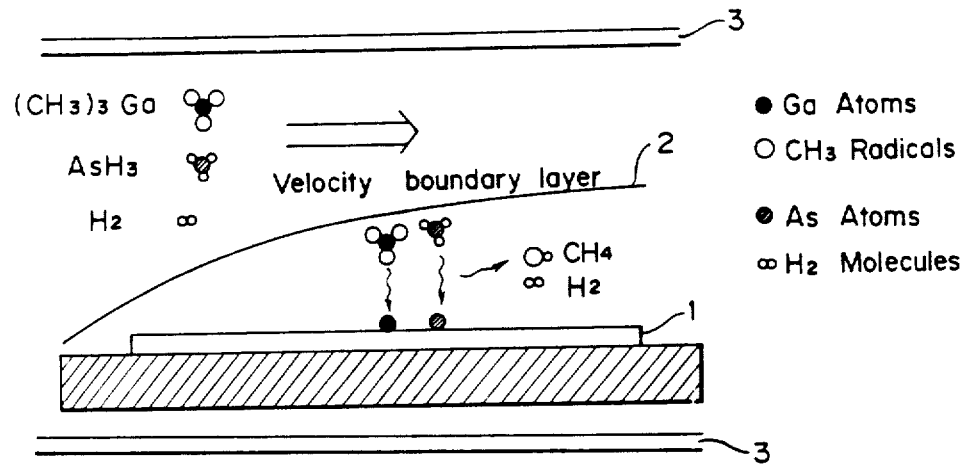
FIG. 1 is a view used to explain a conventional Metal-Organic Chemical Vapor Deposition (MOCVD) method.
Figure 2:
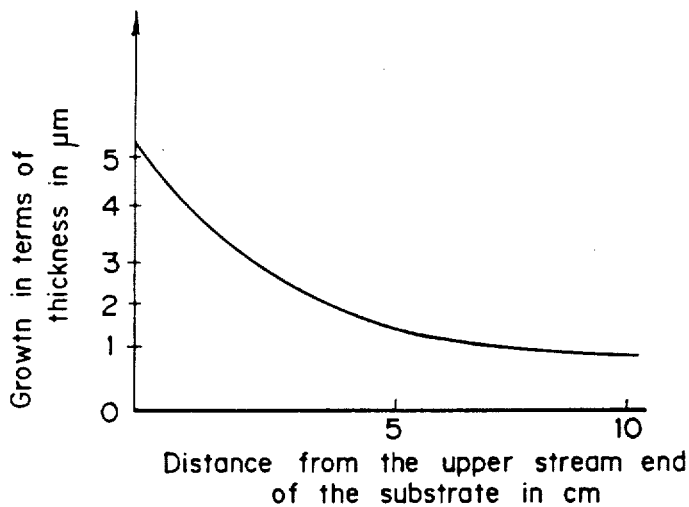
FIG. 2 shows the distribution of the thickness of a compound semiconductor formed by the MOCVD method.
Figure 3:
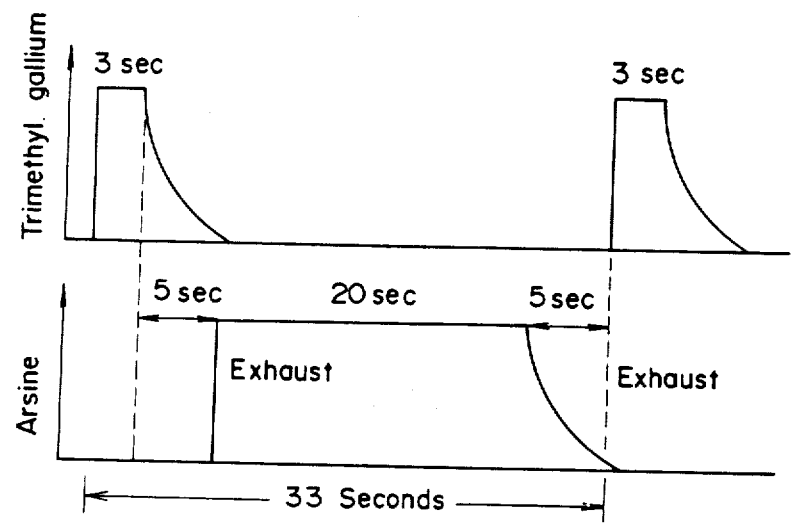
FIG. 3 is a time chart illustrating the timing for the introduction of source elements in the conventional molecular layer epitaxial (MLE) method.
Figure 4:
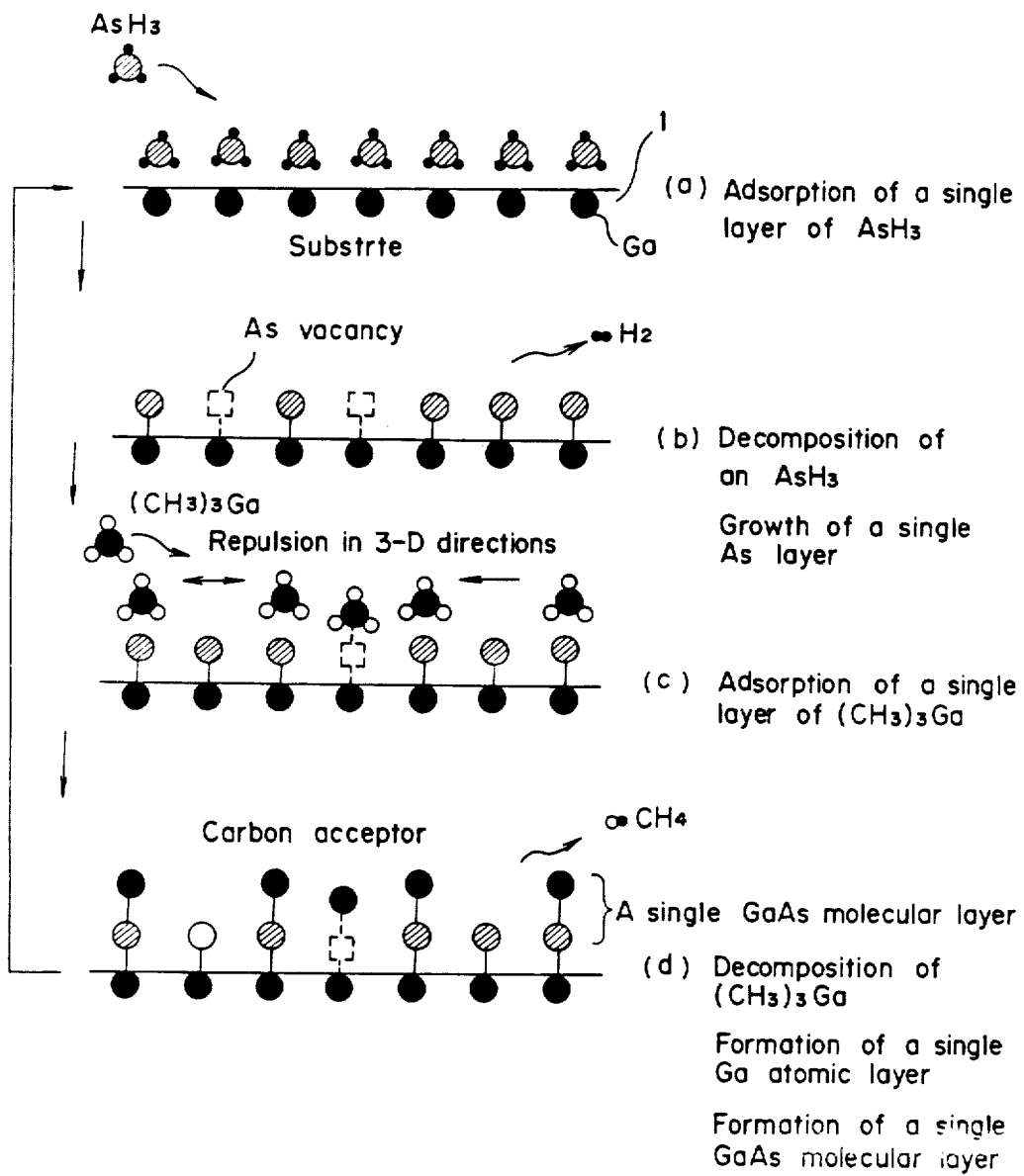
FIG. 4 is a view used to explain the conventional MLE method.
Figure 5:
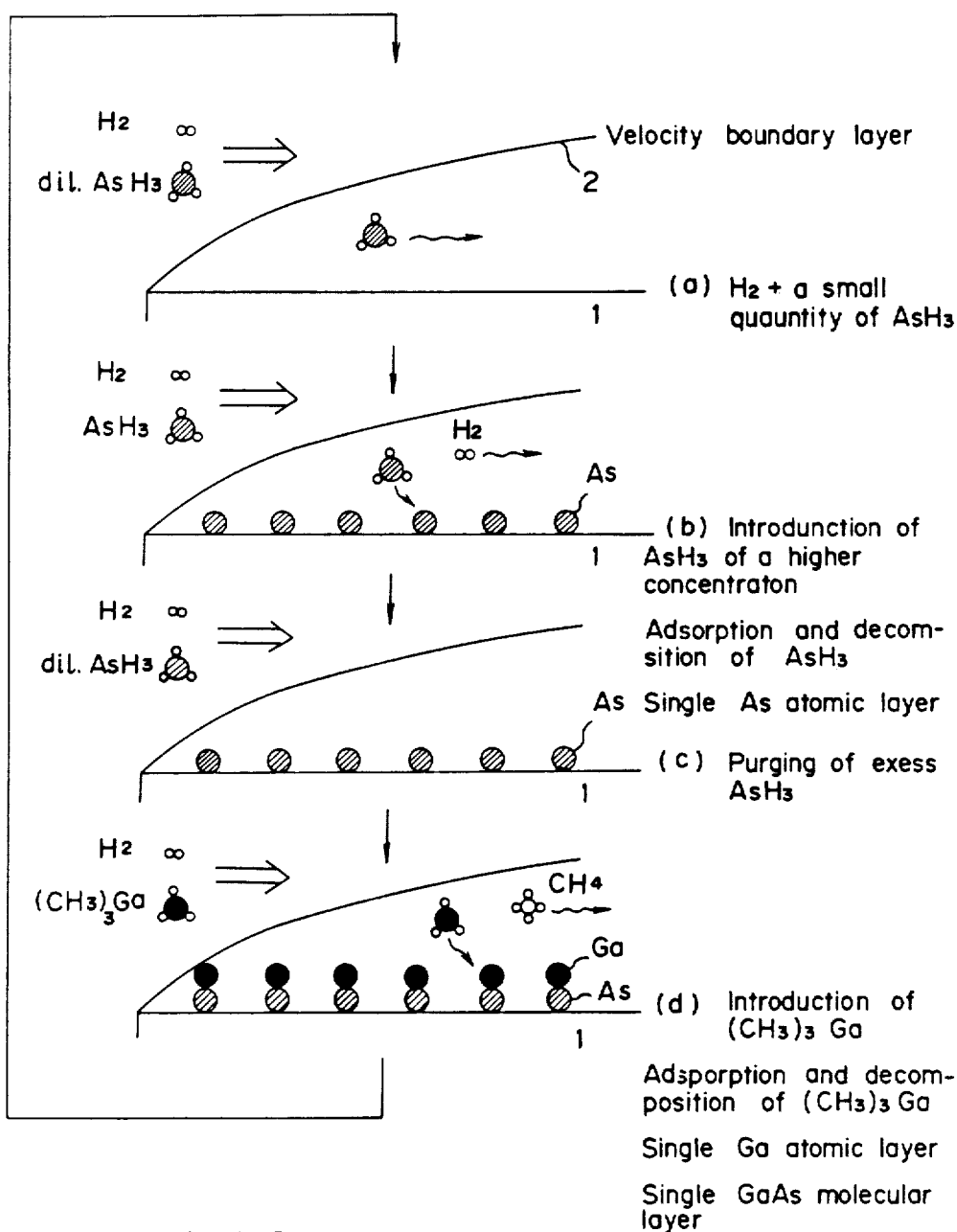
FIG. 5 is a view used to explain the underlying principle of the present invention.

Referring first to FIG. 5, the present invention will be described in connection with GaAs which is a typical III-V compound semiconductor Arsine which is diluted to a first concentration by hydrogen carrier gas is made to flow at a very small flow rate over the surface of a GaAs substrate (FIG. 5A) throughout the duration of growth. The amount of arsine is diluted to such an extent that even when trimethyl gallium is made to flow over the GaAs substrate, they fail to react with each other and consequently no GaAs is formed. When arsine is diluted by hydrogen carrier gas to a second concentration which is higher in arsine than the first concentration and is made to flow together with the hydrogen carrier gas, arsine is adsorbed by Ga atoms of the GaAs substrate over the surface of the substrate and then is subjected to thermal decomposition so that As atoms and Ga atoms are combined and a single As atomic layer is formed over the surface of the substrate (FIG. 5B). Adsorption and thermal decomposition continue until the surface of the substrate is completely covered with a single As atomic layer. After the formation of the As atomic layer, since the power of adsorption of As atoms for arsine is weak, the succeeding flow of arsine is not adsorbed and is discharged out of the system. Next, the flow of arsine at the second concentration is stopped and excess arsine is purged (FIG. 5C) and trimethyl gallium diluted with hydrogen is made to flow (FIG. 5D). Trimethyl gallium is strongly adsorbed by the single As atomic layer over the surface of the substrate and is subjected to thermal decomposition so that Ga atoms and As atoms are combined and consequently a single Ga atomic layer is formed over the single As atomic layer. After the formation of the single Ga atomic layer, the succeeding trimethyl gallium is discharged out of the system because the power of trimethyl gallium to combine with Ga atoms is weak. After the formation of the single Ga atomic layer, the flow of trimethyl gallium is stopped and excess trimethyl gallium is purged (FIG. 5A). Thereafter, arsine which is diluted with hydrogen to produce a relatively high concentration of arsine and trimethyl gallium diluted by hydrogen are made to flow repeatedly, a single GaAs molecular layer being formed uniformly over the whole surface of the GaAs substrate during each cycle. According to the present invention, arsine diluted to the first concentration is always made to flow as described above, so that As is prevented from desorption from GaAs grown. In addition, the hydrogen gas is also made to normally flow so that methyl radicals resulting from the decomposition of trimethyl gallium are reduced by hydrogen to became methane which is not incorporated to a compound and consequently no carbon acceptor is formed. So far, the alternate flows of arsine and trimethyl gallium have been described, but even when the flows of arsine and trimethyl gallium are reversed, the same result as described above is obtained except that trimethyl gallium is strongly adsorbed by As atoms over the surface of the GaAs substrate and then is subjected to thermal decomposition, thus forming a single Ga atomic layer.

Figure 6:
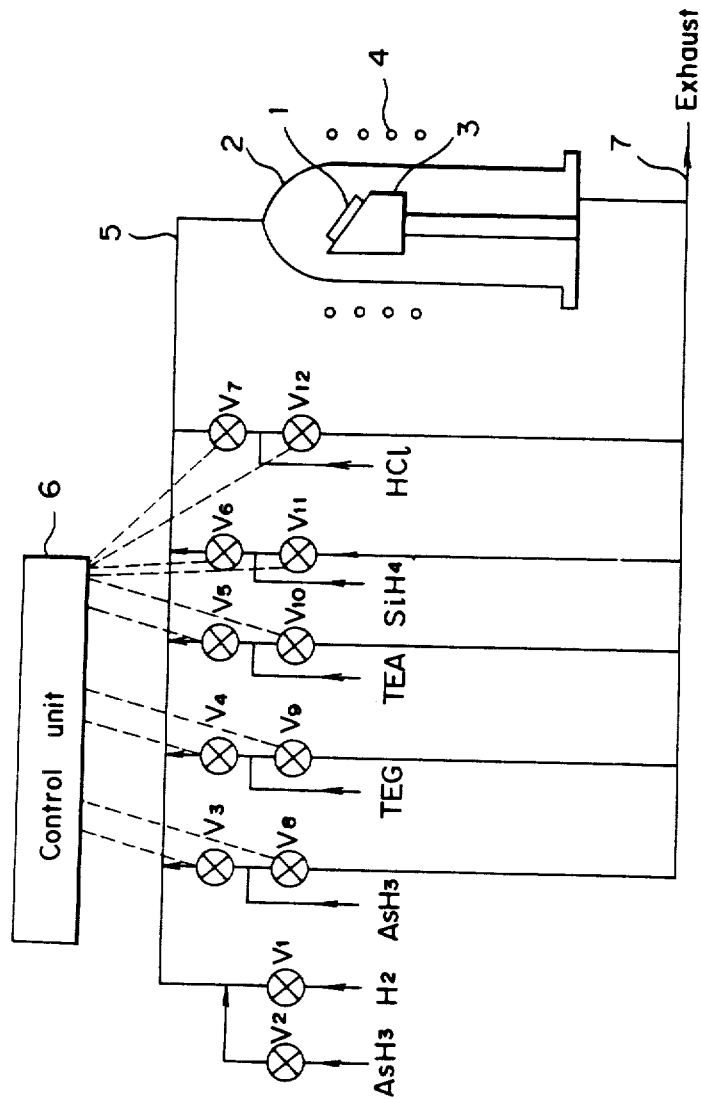
FIG. 6 is a schematic view of an apparatus used to carry out the present invention.

FIG. 6 is a schematic view of an apparatus used to carry out the present invention. Reference numeral 1 designates a substrate; 2, a reaction chamber; 3, a substrate holder; 4, a heating device such as a high frequency induction coil; 5, a pipe line; and $V_1$–$V_{12}$, valves. The valves $V_1$ and $V_2$ are so adjusted that a small quantity of hydride of an element in group V which is diluted by a carrier gas and the carrier gas are always made to flow continuously through the reaction chamber 2. The valves $V_3$–$V_{12}$ are used to introduce source gases for forming a compound semiconductor, hydrogen halide to be described in detail hereinafter and an impurity gas used for doping into the reaction vessel 2. Such gases in FIG. 6 are described as an example. The valves $V_3$–$V_{12}$ are controlled by a control unit 6 so that a predetermined gas is introduced in a predetermined quantity and for a predetermined time interval into the reaction vessel 2. Reference numeral 7 designates a pipe line for discharging the gases. The reaction vessel 2 shown in FIG. 6 is a vertical type, but it is of course possible to use a horizontal reaction vessel. With the reaction apparatus of the type described, special care has been directed to permit the flow of the carrier gas in large quantities at a high flow rate and to suppress turbulent flows.

EXAMPLE 1

A thin GaAs film was grown over the surface of a GaAs substrate. Arsine ($AsH_3$) was used as a hydride of an element in group V, while trimethyl gallium $(CH_3)_3Ga$ was used as an organometallic compound containing an element in group III.

Figure 7:
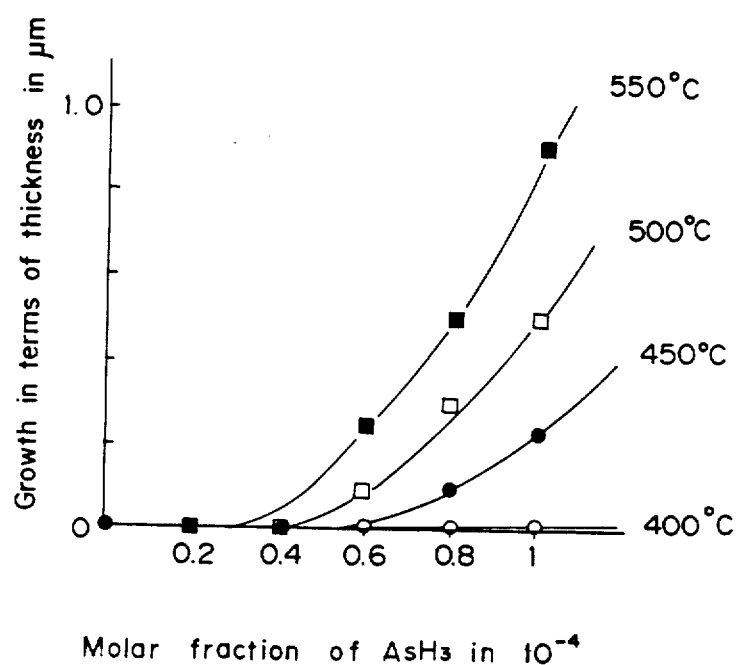
FIG. 7 shows the effect of the concentration of arsine which is normally made to flow continuously.

First, arsine which is made to flow together with hydrogen gas through the duration of the growth will be described. Arsine is used to prevent the evaporation of As from GaAs grown and its concentration is so controlled that it will not react chemically with trimethyl gallium to form GaAs. In the static state, the surface of the substrate (solid phase) and the vapor phase are in a state of equilibrium so that a partial pressure of As in the vapor phase is uniquely defined at a given temperature. However, the actual growing process is dynamic so that an equilibrium dissociation pressure of As at a given temperature must be always maintained. Thermal decomposition efficiency of arsine which supplies As is most greatly dependent upon temperature. Strictly speaking, the thermal decomposition efficiency is dependent upon residence time of arsine over the surface of a substrate; that is, on hydrogen flow rate, but the degree of dependence is very small. FIG. 7 shows the dependence of GaAs grown over the surface of a substrate upon variations in arsine concentration when the temperature of the substrate was varied; the hydrogen flow rate was maintained at a constant value of 10 l/min; arsine was normally made to flow; and trimethyl gallium with a molar fraction of $1 \times 10^{-4}$ was intermittenly flowed at a time interval of one second for 3600 times. The growth of GaAs was measured by observing the cleavage surface with a scanning electron microscope ($\times 50,000$). As is seen from FIG. 7, the growth of GaAs was not confirmed at 400° C. when the molar fraction of $AsH_3$ ranges from 0 to $1 \times 10^{-4}$. As the temperature was increased, the arsine concentration at which GaAs was not grown decreased. At 500° C., GaAs was grown when the molar fraction of $AsH_3$ exceeded $4 \times 10^{-5}$ and at 550° C., GaAs was grown when the molar fraction of $AsH_3$ exceeded $2 \times 10^{-15}$. When the molar fraction of $AsH_3$ was maintained constant, the higher the temperature, the higher the growth rate became. When the temperature of the substrate exceeds 550° C., trimethyl gallium is decomposed so that Ga is condensed on the substrate.

The above-described experimental results show that it is preferable that the concentration (the first concentration) of arsine which is flowed together with the hydrogen carrier gas through the duration of the growth does not excess $4 \times 10^{-5}$ and more particularly is less than $2 \times 10^{-5}$.

Next, arsine which is diluted to the second concentration in order to form a single As atomic layer over the surface of substrate will be described.

Figure 8:
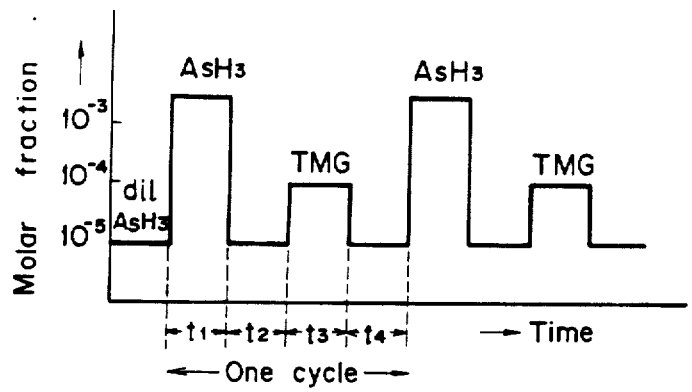
FIG. 8 is a time chart illustrating the timing of the introduction of a source gas.
Figure 9:
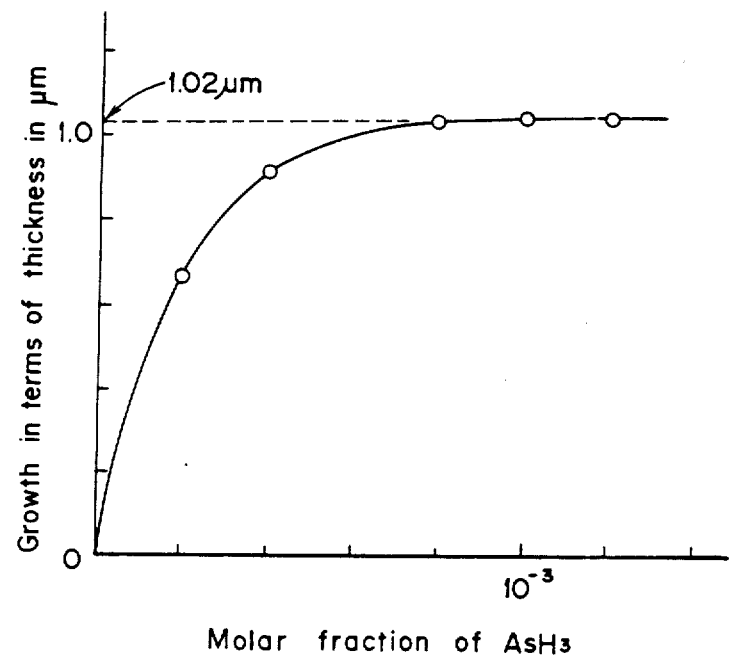
FIG. 9 shows the effect of the concentration of arsine forming an As single atomic layer.

The substrate is maintained at a constant temperature of 450° C.; the hydrogen flow rate is maintained at a constant value of 10 l/min; and arsine with a molar fraction of $1 \times 10^{-5}$ is made to flow together with the hydrogen carrier gas. Arsine and trimethyl gallium (TMG) at a molar fraction of $1 \times 10^{-4}$ are alternately introduced at a time interval of one second as shown in FIG. 8. FIG. 9 shows the results obtained when the thickness of a GaAs film grown over the surface of a substrate after 3600 cycles was measured while the concentration of arsine was varied. It is seen that first the growth of the GaAs film is increased with an increase in the concentration of arsine, but it remains at a constant thickness of 1.02 μm when the molar fraction exceeds $1 \times 10^{-3}$. This means that the GaAs film grows at a rate of 2.83 Å per cycle which corresponds to the thickness of one GaAs molecular layer. In view of the above, it is preferable that the second concentration of arsine is $1 \times 10^{-3}$ or more. In the experiments, no variation in the growth of the GaAs film was observed even when the arsine introduction period was changed to two, three, four and five seconds.

Next, trimethyl gallium for the formation of a single Ga atomic layer will be described.

Figure 10:
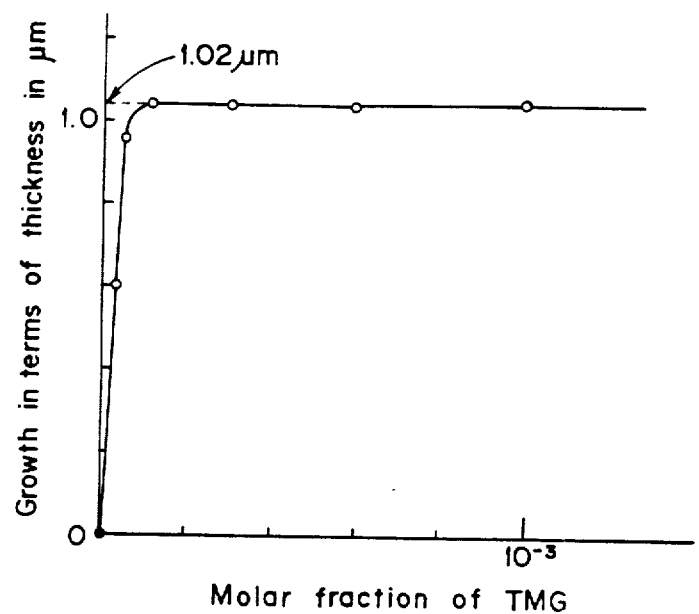
FIG. 10 shows the effect of the concentration of trimethyl gallium.

As in the case of arsine described above, the substrate temperature was maintained at 450° C.; the flow rate of hydrogen was maintained at 10 l/min; and the molar fraction of arsine which is continuously flowing was maintained at $1 \times 10^{-5}$. According to the timing chart as shown in FIG. 8, trimethyl gallium and arsine of a molar fraction of $1 \times 10^{-3}$ were alternately introduced over the surface of the substrate for 3600 cycles and then the thickness of the grown thin film was measured. The thickness of the grown thin film varied as shown in FIG. 10 depending upon the concentration of trimethyl gallium. The thickness remains at a constant value of 1.02 μm when the molar fraction is in excess of $1 \times 10^{-4}$. This means that the GaAs single molecular layer is increased by 2.83 Å per cycle. No variation in the growth was observed even when the trimethyl gallium introduction time was increased use to five seconds in each cycle.

Figure 11:
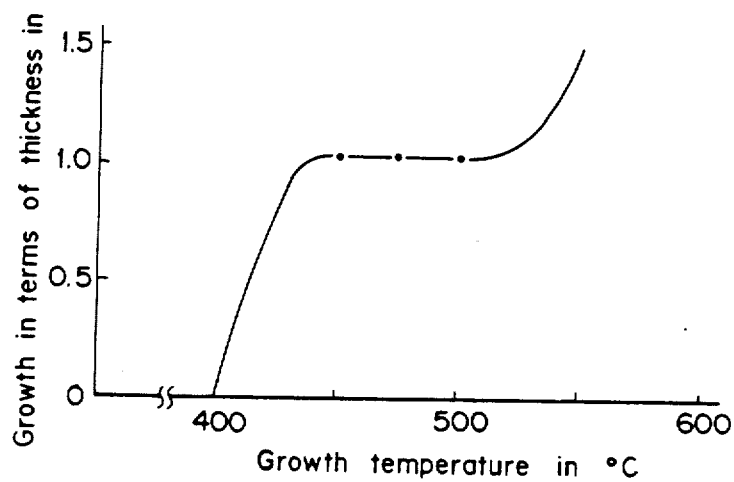
FIG. 11 shows the influence of the growth temperature to the growth.

The growth temperature (that is, the temperature of the substrate) was varied by the heating device of the process chamber shown in FIG. 6 in order to investigate the influence of the variation in growth temperature on the growth of a thin film. The hydrogen flow rate was 10 l/min; the molar fraction of arsine which was normally flowed was $1 \times 10^{-5}$; the molar fraction of arsine which was intermittently flowed was $1 \times 10^{-3}$; the molar fraction of trimethyl gallium was $1 \times 10^{-4}$; and the introduction time interval and the interruption time interval were one second, respectively, in each cycle as shown in FIG. 8. FIG. 11 shows the thickness of a thin film grown after 3600 cycles. It is seen that no growth is observed at 400° C., at a temperature in excess of 430° C. the growth thickness becomes about one μm; from a temperature about 450° C. to a temperature of slightly higher than 500° C., the growth rate in each cycle remains 1.02 μm which corresponds to the thickness of a GaAs single molecular layer; and when the growth temperature exceeds 520° C., the growth is suddenly increased. When the growth temperature is 550° C., the growth is in excess of the growth of a single atomic layer and the surface of the grown thin film is roughened. In view of the above, it is preferable that the growth temperature is between 430° and 520° C. and it is more preferable that the growth temperature is between 450° C. and 500° C.

In the experiments described above, the time interval between the time when arsine is introduced for growing a single As atomic layer and the time when trimethyl gallium is introduced for growing a single Ga atomic layer is one second as shown in FIG. 8 and during this time interval the hydrogen carrier gas and an extremely small quantity of arsine are made to flow through the process chamber. The reason that the excess arsine and excess trimethyl gallium are purged is so that the complete exchange between the source gases may be ensured. In the case of apparatus of the type schematically shown in FIG. 6, a source gas can be replaced by another source gas within 0.1 second. The temperature of the substrate was maintained at 450° C.; the hydrogen flow rate was maintained at 10 l/min; the molar fraction of arsine which was made to flow always continuously was maintained $1 \times 10^{-5}$; the molar fraction of arsine for growing a single As atomic layer was maintained at $1 \times 10^{-3}$; the molar fraction of trimethyl gallium was maintained at $1 \times 10^{-4}$; and $t_2$ and $t_4$ shown in FIG. 8 were varied while $t_1$ and $t_3$ were maintained at one second. The time $t_2$ and $t_4$ were varied from one to five seconds, but no variation in growth was observed.

Figure 12:
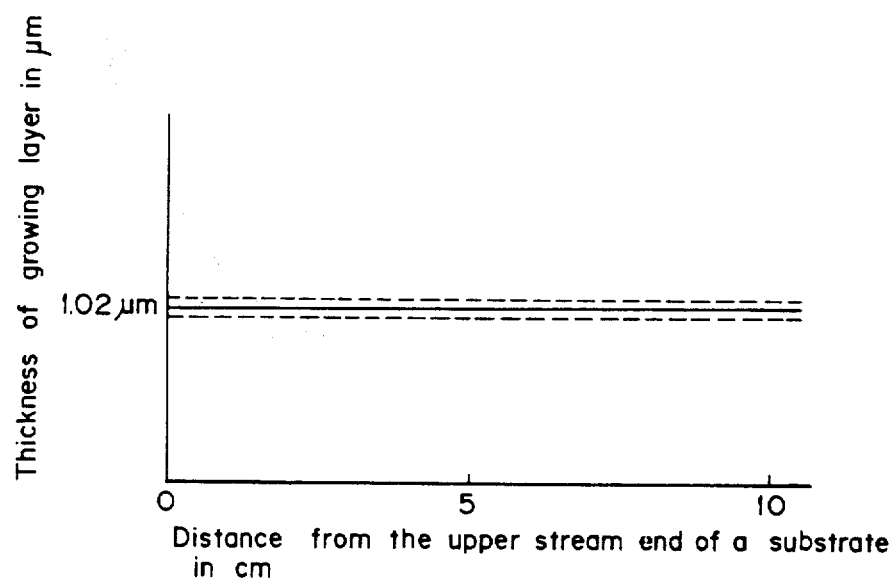
FIG. 12 shows the thickness distribution of GaAs grown by a method in accordance with the present invention.

FIG. 12 shows the thickness measured in the longitudinal direction of a GaAs film grown after 3600 cycles each of which consists of the introduction for one second and the interruption for one second of arsine at a molar fraction of $1 \times 10^{-3}$ and the introduction for one second and the interruption for one second of trimethyl gallium at a molar fraction of $1 \times 10^{-4}$ while the growth temperature at the (100) surface of GaAs over which the GaAs film was grown was maintained at 450° C.; the hydrogen flow rate was maintained at 10 l/min; and the molar fraction of arsine which was always made to flow was maintained at $1 \times 10^{-5}$. The measurement was made over the cleavage surface by a scanning electron microscope.

Figure 13:
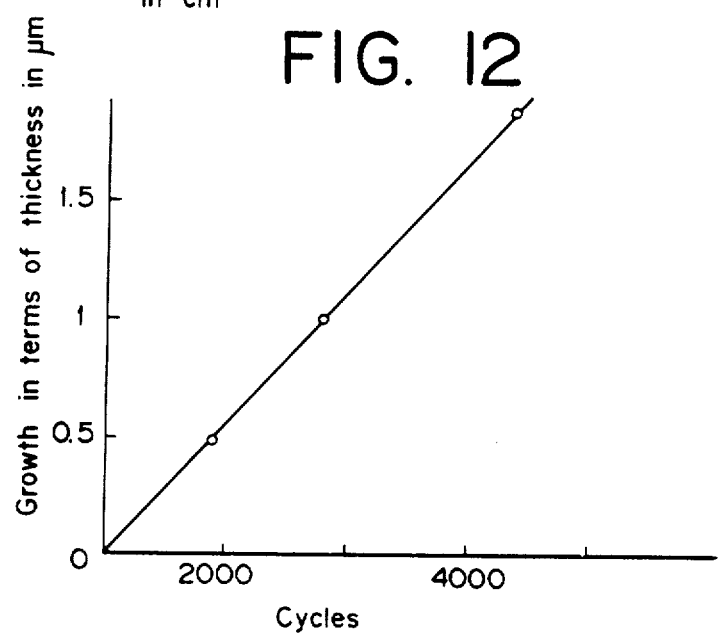
FIG. 13 is a view illustrating the dependence of the thickness of GaAs grown upon a source gas introduction cycle.

The thickness of the grown film was uniform and the decrease in thickness of the grown film from the upper stream end to the downstream end of the substrate, which is often observed in the case of a thin film grown by the conventional MOCVD method, was not observed. That is, a thin film was grown uniformly over the whole surface of the substrate. The growth rate per cycle was 2.83 Å which indicates the fact that the growth of a single GaAs molecular layer was realized. Under the same conditions described above with reference to FIG. 12, the dependence of the thickness of the grown thin films on the number of cycles was investigated and the experimental results are shown in FIG. 13. It is seen that the thickness of grown films is dependent on the number of cycles and that the growth rate per cycle is estimated at 2.83 Å which also indicates a single molecular layer growth due to single atomic layer growth. So far, as shown in FIG. 8, the cycle consisting of the introduction of AsH$_3$, the interruption of the introduction thereof, the introduction of TMG and the interruption thereof has been explained, but it is understood that even when a cycle starting from the introduction of TMG is used, the growth of a compound is substantially similar to that described above.

The carrier concentration obtained from the electric characteristics of the grown layer was p-type $10^{17}$cm$^{-3}$ and the purity was improved by a factor of two compared with a method in which no hydrogen is used. This means that methyl radicals resulting from the thermal decomposition of trimethyl gallium are reduced by hydrogen introduced in accordance with the present invention as shown in (1) below and become methane so that carbon is not incorporated into the crystals.

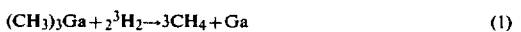

(1)

Furthermore, the photoluminescence intensity was satisfactorily comparable with a specimen which was fabricated by the liquid phase epitaxial growth method and which has the same carrier concentration. This means that the layers grown in accordance with present invention have a high quality and are almost free from crystal defects. The reason is that the evaporation of As from the grown layer is prevented. Furthermore, the evaporation of As can be also prevented when the first diluted concentration of arsine is $1 \times 10^{-6}$ in terms of molar fraction.

In addition, when triethyl gallium is used instead of trimethyl gallium, the electric property of the grown layer becomes n-type $10^{14}$cm$^{-3}$ and consequently the purity can be further improved. In the case of triethyl gallium, the following chemical reaction results

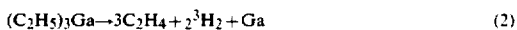

(2)

That is, ethylene is produced and essentially carbon is not likely to be incorporated in the crystals. As a result, a grown layer with a further high degree of purity can be obtained as compared with the case in which trimethyl organometallic compounds are used.

EXAMPLE 2

In addition to GaAs, III-V compound semiconductor thin films were grown.

Trimethyl aluminum (CH$_3$)$_3$Al and arsine (AsH$_3$) were used as source gases to grow an AlAs thin film over the (100) surface of an AlAs substrate. The introduction of source gases is substantially similar to that described above in detail with reference to FIG. 8 except that instead of TMG, trimethyl aluminum TMA (at a molar fraction of $1 \times 10^{-4}$) was used. The growth thickness at the growth temperature was 1.02 µm after 3600 cycles and a single AlAS molecular layer was formed during one cycle.

PH$_3$ may be used as the hydride for growing GaP while trimethyl gallium may be used as the organometallic compound. With PH$_3$ which is diluted to a molar fraction of $1 \times 10^{-5}$ (a first concentration) and to a molar fraction of $1 \times 10^{-3}$ (a second concentration) and TMG at a molar fraction of $1 \times 10^{-4}$, a thin film was grown on the (100) surface of a GaP substrate by 3600 cycles at a source gas introduction and interruption timing similar to that described above with reference to FIG. 8. At the growth temperature of 450° C., the thickness of the grown film layer was 0.98 µm and a single GaP molecular layer was formed during each cycle.

With trimethyl indium (CH$_3$)$_3$In (with a molar fraction of $1 \times 10^{-4}$) and stibine SbH$_3$ (with molar fractions of $1 \times 10^{-5}$ and $1 \times 10^{-3}$, respectively), a thin film was grown over the (100) surface of an InSb substrate at the growth temperature of 450° C. at a source gas introduction and interruption timing similar to that described above with reference to FIG. 8 by repeating 3600 cycles. The growth was 1.17 µm in terms of thickness and a single InSb molecular layer was formed during each cycle.

In like manner, with (CH$_3$)$_3$Al and PH$_3$, an AlP thin film can be grown; with (CH$_3$)$_3$Al and SbH$_3$, an AlSb thin film can be grown; with (CH$_3$)$_3$Ga and SbH$_3$, a GaSb thin film can be grown; with (CH$_3$)$_3$In and PH$_3$, an InP thin film can be grown; and with (CH$_3$)$_3$In and AsH$_3$, an InAs thin film can be grown. After 3600 cycles, the AlP film is 0.98 µm in thickness; the AlSb film, 1.10 µm in thickness; the GaSb film, 1.10 µm in thickness; the InP film, 1.06 µm in thickness; and the InAs, 1.09 µm in thickness. In any case, the film was grown uniformly over the surface of the substrate and was free from vacancies of Group V elements so that no carbon acceptor was introduced.

In this case, as in the case of GaAs, when triethyl aluminum, triethyl gallium and triethyl indium are used as the organometallic compound, crystals having a high degree of purity can be obtained.

The effects of the growth temperature and the concentrations of source gases are substantially similar to those described above in connection with EXAMPLE 1.

EXAMPLE 3

The present invention can be equally applied to II-VI compound semiconductors.

Dimethyl zinc $(CH_3)_2Zn$ was used as an organometallic compound while hydrogen sulfide $H_2S$ was used as a hydride and a thin ZnS film was grown over the (100) surface of an ZnS substrate. The growth temperature was maintained at 450° C.; the hydrogen carrier gas flow rate was maintained at 10 l/min; the molar fraction of $H_2S$ which was always made to flow was maintained at $1 \times 10^{-5}$; the molar fraction $H_2S$ for growing a single S atomic layer was maintained at $1 \times 10^{-3}$; the molar fraction of $(CH_3)_2Zn$ was maintained at $1 \times 10^{-4}$; and these source gases were introduced and interrupted at a time interval of one second as shown in FIG. 8. After 3600 cycles, the thickness of the grown film was 0.97 μm and the increase in thickness of ZnS grown per cycle was equivalent to a single ZnS molecular layer.

With dimethyl zinc $(CH_3)_2Zn$ and $H_2Se$, a thin ZnSe film was formed over the (100) surface of a ZnSe substrate. The growth temperature was maintained at 450° C.; the hydrogen flow rate was maintained at 10 l/min; the molar fraction of $H_2S$ which was always made to flow was maintained at $1 \times 10^{-5}$; the molar fraction of $H_2Se$ for forming a single Se atomic layer was maintained at $1 \times 10^{-3}$; the molar fraction of $(CH_3)_2Zn$ was maintained at $1 \times 10^{-4}$; and the introduction of these source gases and the interruption thereof were repeated at a time interval of one second. After 3600 cycles, the growth was 1.02 μm in terms of thickness and one ZnSe molecular layer was formed during each cycle.

When dimethyl mercury $(CH_3)_2Hg$ was used as an organometallic compound while $H_2Se$ was used as a hydride, a thin HgSe film was grown over the (100) surface of a HgSe substrate in a manner substantially similar to that described above in connection with the formation of a ZnSe film. After 3600 cycles, the growth was 1.10 μm in terms of thickness and a single HgSe molecular layer was formed during each cycle.

In all cases, a thin film was formed uniformly over the whole surface of a substrate and was almost free from vacancies due to desportion of VI group elements and from the intrusion of carbon acceptors. When $(C_2H_5)_2Zn$ or $(C_2H_5)_2Hg$ is used instead of $(CH_3)_2Zn$ or $(CH_3)_2Hg$; the intrusion of carbon acceptors can be further suppressed.

The effects of the growth temperature and the concentrations of source gases are substantially similar to those described above in connection with EXAMPLE 1.

In EXAMPLE 1-3, the substrates have been described as comprising a single crystal, but it is understood that polycrystal substrates can be used depending upon the kinds and uses of compound semiconductors to be formed.

EXAMPLE 4

By using arsine $AsH_3$, trimethyl gallium (TMG) and trimethyl aluminum (TMA), a hetero-structure semiconductor thin film of $Al_{0.5}Ga_{0.5}As$-$GaAs$-$Al_{0.5}Ga_{0.5}As$ was grown on the (100) surface of a GaAs substrate in the apparatus as shown in FIG. 6.

Figure 14:
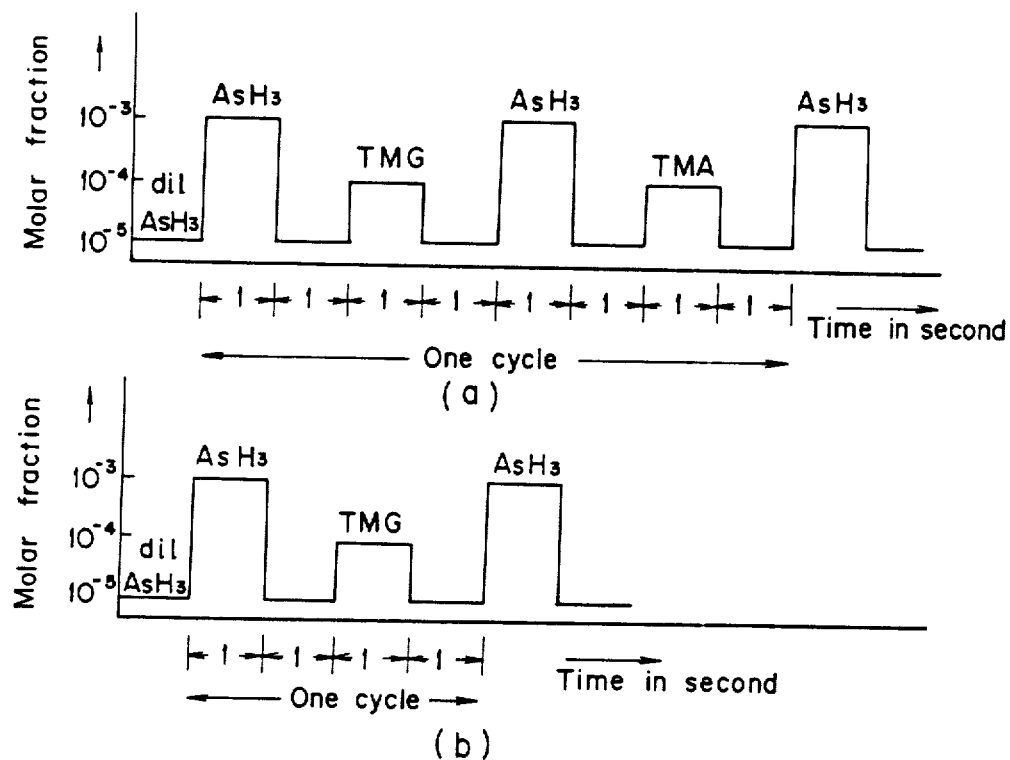
FIG. 14 is a time chart illustrating the timing of the introduction of source gases in case of formation of a hetero-structure composed of compound semiconductors.

The growth conditions were that the hydrogen flow rate was maintained at 10l/1 min; the molar fraction of arsine which was always forced to flow was maintained at $1 \times 10^{-5}$; and the molar fractions of arsine, TMG and TMA for forming single atomic layers were maintained at $1 \times 10^{-3}$, $1 \times 10^{-4}$ and $1 \times 10^{-4}$, respectively. A cycle which, as shown in FIG. 14A, consists of the introduction and interruption of arsine, the introduction of TMG and interruption thereof and the introduction of TMA and interruption thereof which are spaced in time from each other by one second was repeated 100 times, and a cycle which, as shown in FIG. 14B, consists of the introduction of arsine and interruption thereof and the introduction of TMG and interruption thereof was repeated ten times. Thereafter the cycle describe above with reference to FIG. 14A was repeated further 100 times.

Figure 15:
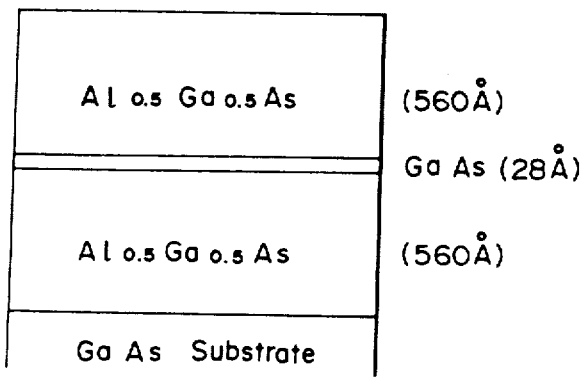
FIG. 15 is a view illustrating a hetero-structure formed by the invention.

As a result, a hetero-structure as shown in FIG. 15 was obtained and a thin GaAs layer makes a quantum well. The quantum-well-luminescence of GaAs quantum wells of the quantum-well structures formed by the conventional MBE and MOCVD methods has a wavelength of 710 nm and a half-width of 15-30 meV are widely different from the theoretical values and therefore reflect the hetero-boundary surface roughness.

On the other hand, according to the present invention, the wavelength is 710 nm and the half-width is 6 meV which is considerably lower than the half-width of 30 meV expected from the surface roughness with a height of one atomic layer at a hetero-interface. This proves that the hetero-interface has no surface roughness.

In the two-dimensional electron gas structures which are fabricated by the conventional methods and in which the electrons travel along the hetero-interface, the mobility is lower than a theoretical value because of scattering of electrons at the interface. However, in the case of a two-dimensional electron gas structure fabricated by a method of the present invention, the scattering of electrons due to the rough surface at the hetero-interface can be completely eliminated so that the mobility of two-dimensional electron gas can be significantly increased.

Figure 16:
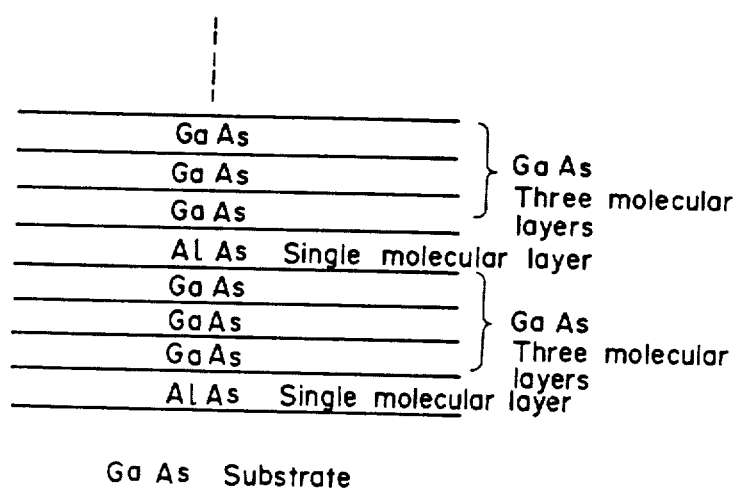
FIG. 16 is a view used to explain an ordered alloy structure formed by the invention.

In addition, according to the present invention, by using the controllability of a single atomic layer, it becomes possible to grow an $Al_{0.25}Ga_{0.75}As$ crystal in which atoms are regularly arranged as shown in FIG. 16. The electrical and optical characteristics of ternary alloy crystals grown in accordance with the present invention in the manner described above are by far superior to those of conventional alloy crystals in which the atoms belonging to the same groups are statistically randomly arranged. For instance, in conventional alloy semiconductors, conduction electrons are scattered by a potential field produced by atoms which are randomly arranged so that the mobility is low, but in the case of an alloy semiconductor in which atoms are arranged regularly, a potential field is periodically produced so that the mobility can be significantly increased.

According to the above-described method of the present invention comprising the steps of normally flowing a hydride containing Group V or VI elements which do not react with an organometallic compound to produce a III-V or II-VI compound and which is diluted to a first concentration with a hydrogen carrier gas while a hydride which is diluted by hydrogen to a second concentration higher than the first concentration is introduced over the surface of a substrate; interrupting the introduction of the hydride of the second concentration; introducing over the surface of the substrate an organometallic compound which is diluted by hydrogen and contains Group III or II elements; interrupting the introduction of the organometallic compound; and cycling the above-described steps, an epitaxially grown GaAs layer is obtained which is almost free of As vacancies and free from carbon contamination. According to this method, the growth of a GaAs film can be controlled with a single-atomic-layer accuracy and the growth rate can be increased so that the time required for growing a film 1 μm in thickness can be reduced to two hours.

Figure 17:
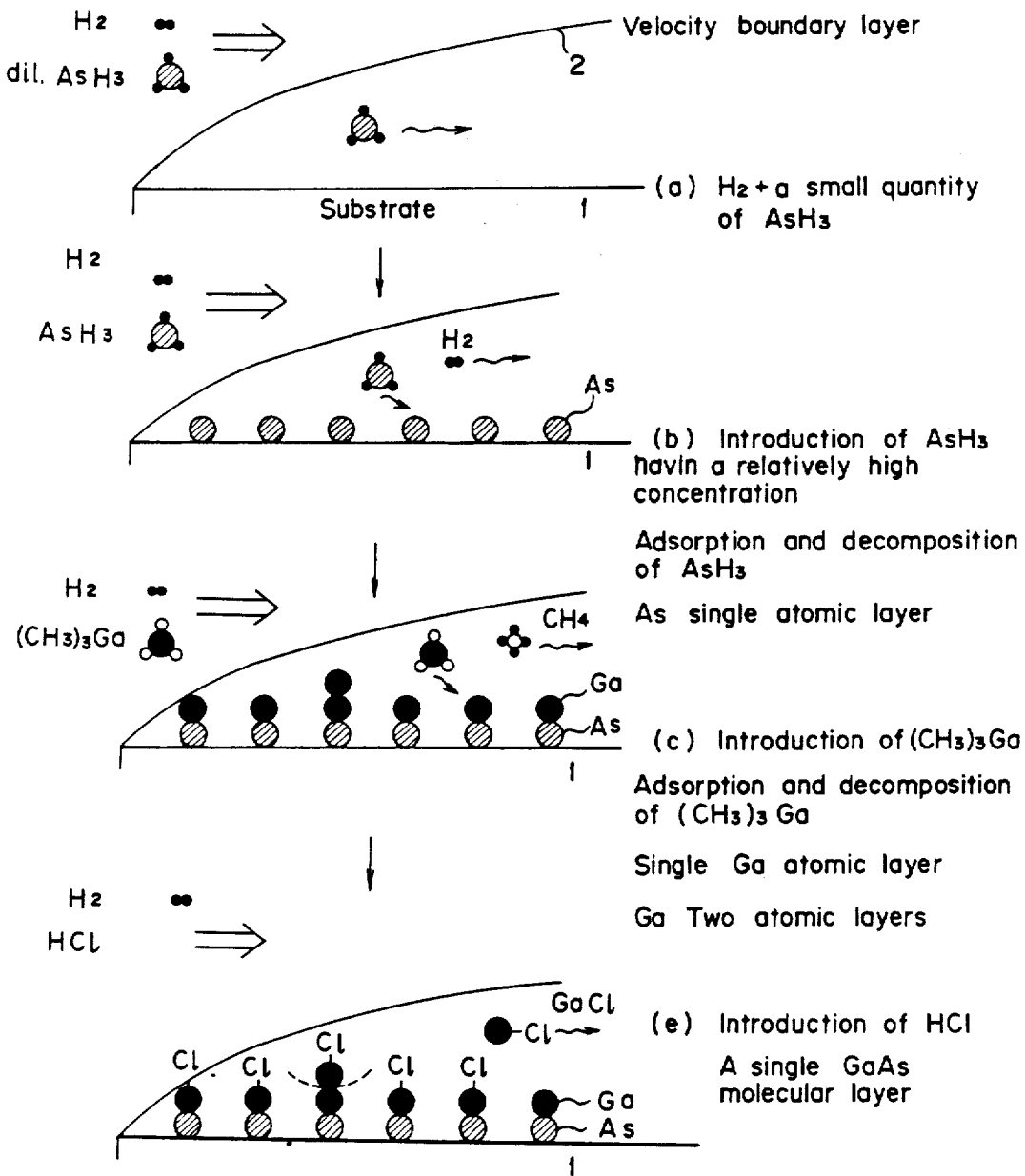
FIG. 17 is a view used to explain the action of hydrogen chloride.

However, the GaAs layers which are epitaxially grown by the above-described method still have surface defects so that they are not perfect from the standpoint of a crystal. The inventors discovered the fact that such crystal defects are due to formation of a two-layer structure of III or II group elements during the formation of the crystal; and the two-layer structure can be eliminated by introducing hydrogen halide during the growth of the crystal. The two-layer structure of III or II group elements and the action of hydrogen halide on such two-layer structures will be described in detail below in connection with GaAs, which is a III-V compound semiconductor, with reference to FIG. 17. First, a small quantity of arsine which is diluted by a hydrogen gas carrier to a first concentration is made to normally flow over the surface of a GaAs substrate which is heated (FIG. 17A). Arsine is diluted to such an extent that even when it makes contact with trimethyl gallium (TMG), it does not react therewith to produce GaAs. Next arsine diluted to a second concentration higher in arsine than the first concentration and the hydrogen gas carrier are made to flow. Then, arsine is adsorbed by the Ga atoms on the surface of the substrate and is subjected to thermal decomposition to free As atoms which in turn combine with Ga atoms, whereby a single As atomic layer is formed over the surface of the substrate (FIG. 17B). Such adsorption and decomposition continue until the whole surface of the substrate is covered with a single As atomic layer. Once the single As atomic layer is formed the succeeding arsine is not adsorbed and is discharged out of the system because the adsorption power between As atoms and arsine is weak. Next, the introduction of arsine of the second concentration is interrupted and trimethyl gallium (TMG) diluted by hydrogen is introduced (FIG. 17C). TMG is strongly adsorbed by the single As atomic layer over the surface of the substrate and is subjected to thermal decomposition so that Ga atoms are combined with As atoms, whereby a single Ga atomic layer is formed over the single As atomic layer. That is, a single GaAs molecular layer is formed over the surface of the substrate. Since adsorption of trimethyl gallium by Ga atoms is weak, trimethyl gallium which is introduced after the formation of the single Ga atomic layer is discharged out of the system, but part of it is decomposed on the single Ga atomic layer so that a two-layer structure of Ga atoms is partially formed.

Next hydrogen chloride diluted with hydrogen is introduced (FIG. 17D) so that the Ga atoms on the surface of the substrate combine with chlorine atoms and the Ga atoms at the upper portion of the two-layer structure having a weak Ga-Ga bonding strength are discharged out of the system in the form of gaseous GaCl. Thus, a single GaAs molecular layer is formed over the surface of the substrate. Upon interruption of the introduction of hydrogen chloride, the Cl atoms combined with the Ga atoms are freed therefrom and recombine with the hydrogen atoms in the carrier gas or the hydrogen atoms resulting from the thermal decomposition of arsine so that they are discharged out of the system in the form of gaseous HCl.

Thereafter, the introduction of arsine diluted with hydrogen to the second or high concentration, the introduction of trimethyl gallium diluted with hydrogen and the introduction of hydrogen chloride diluted with hydrogen are repeated in the order named so that a single GaAs molecular layer is uniformly formed over the whole surface of the GaAs substrate during each cycle.

According to the method of the present invention, dilute arsine is made to flow continuously through the process chamber so that the desorption of As from GaAs grown can be prevented. Furthermore, hydrogen gas is forced to normally flow through the process chamber so that the methyl radicals resulting from the decomposition of trimethyl gallium are reduced by hydrogen to become methane. Since methane thus produced is not trapped by a compound no carbon acceptor is formed. A portion above the single atomic layer formed partially during the formation of a Ga surface is easily freed in the form of gallium chloride having a high vapor pressure by introducing hydrogen chloride. Thus, the perfect formation of each single atomic layer is ensured. So far, arsine, trimethyl gallium and hydrgen chloride have been described as being introduced in the order named repeatedly but even when trimethyl gallium, hydrogen chloride and arsine are introduced in the order named, repeatedly, the same reaction processes as described above are obtained except that trimethyl gallium is strongly adsorbed by the As atoms over the surface of a GaAs substrate and then is subjected to decomposition, whereby a single Ga atomic layer is formed.

So far, in order to eliminate the two-layer structure of Ga, HCl is used, but it is understood that other hydrogen halides such as hydrogen fluoride HF and hydrogen bromide HBr may be used. When HF is used, the process chamber must be made of a material which is not attacked by fluorine.

In addition, so far it has been described that as the best method, hydrogen is used as a carrier gas for introducing arsine, trimethyl gallium and hydrogen chloride, but even when an inactive gas such as helium He or argon Ar is used as a carrier gas, the desorption of As from GaAs grown can be prevented when dilute arsine is normally introduced. As a result, vacancies are not made so that even when the methyl radicals are not reduced, carbon atoms can be prevented from being trapped into a grown compound film.

EXAMPLE 5

A thin GaAs film was grown over the surface of a GaAs substrate by the apparatus shown in FIG. 6. The substrate was a single crystal and the film was grown over the (100) surface thereof. Arsine $AsH_3$ was used as a hydride of an element in Group V while trimethyl gallium $(CH_3)_3Ga$ was used as an organometallic compound containing an element in Group III.

Figure 18:
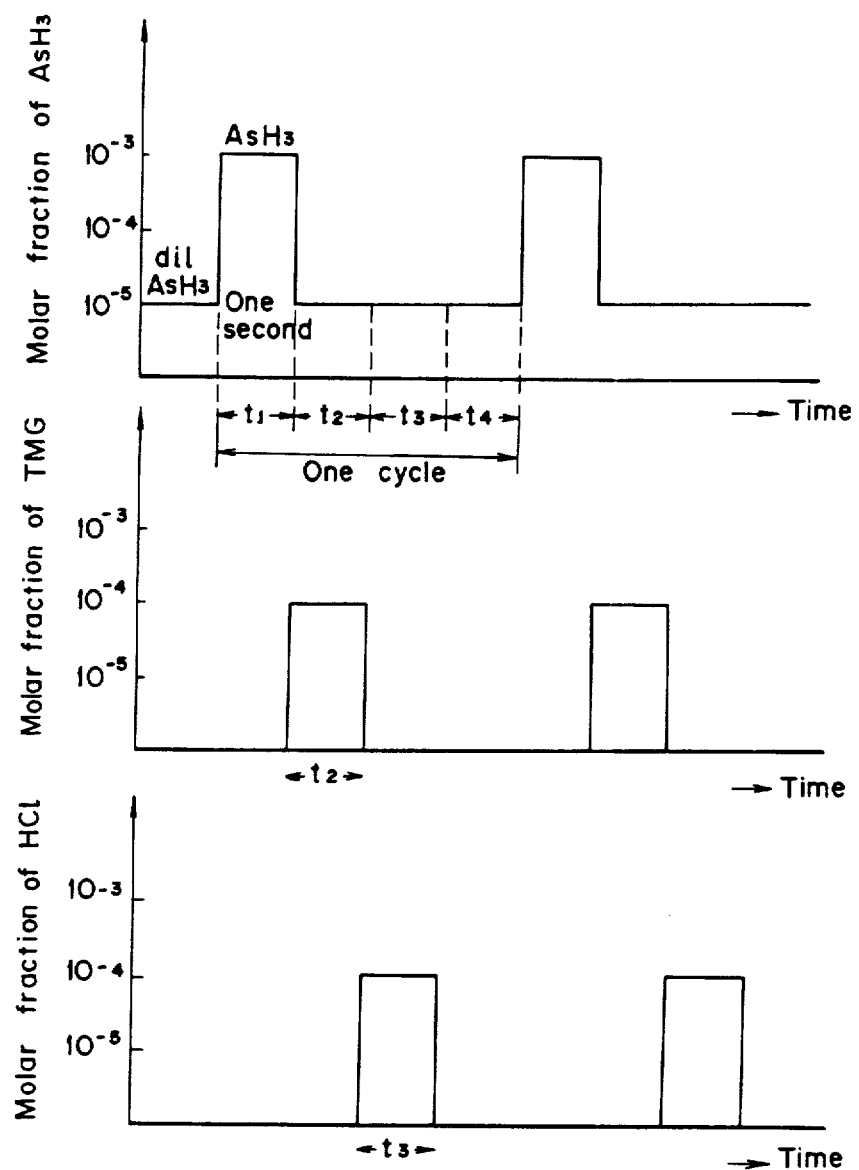
FIG. 18 is a diagram used to explain the effect of reducing surface defect densities depending upon the concentration of hydrogen chloride.

FIG. 18 is diagram illustrating the timing of the introduction of AsH$_3$, TMG and HCl over the surface of the substrate and one cycle is defined as consisting of t$_1$-t$_4$.

In this EXAMPLE 5, arsine which was diluted with hydrogen and has a molar fraction of $1 \times 10^{-5}$ was normally introduced while arsine which was diluted with hydrogen and had a molar fraction of $1 \times 10^{-3}$, and TMG of a molar fraction of $1 \times 10^4$ were sequentially introduced for a time interval of one second, respectively.

Figure 19:
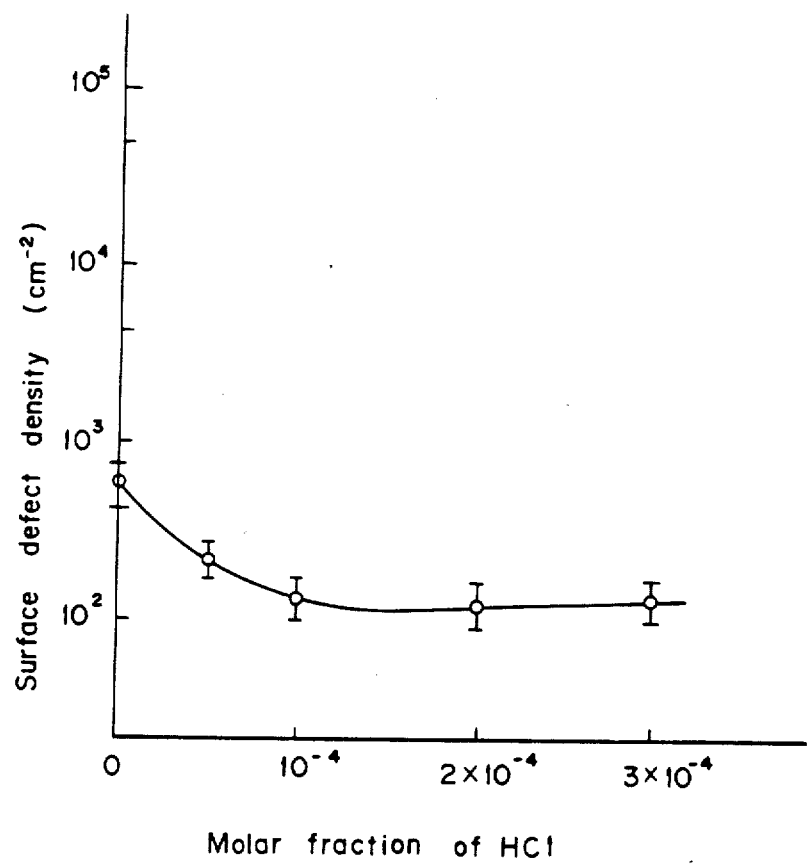
FIG. 19 is a time chart illustrating the timing of the introduction of a source gas.

Arsine which is normally flowed together with hydrogen, arsine for forming an As atomic layer and TMG have been already described. Therefore, hydrogen chloride for forming a single Ga atomic layer will be described. The temperature of the substrate was maintained at 450° C.; the hydrogen flow rate was maintained at 10 l/min; the molar fraction of arsine which was normally flowed together with hydrogen was maintained at $1 \times 10^{-5}$; and the molar fraction of trimethyl gallium was maintained at $1 \times 10^{-4}$. Arsine of a molar fraction of $1 \times 10^{-3}$, trimethyl gallium of a molar fraction of $1 \times 10^{-4}$ and hydrogen chloride whose concentration was varied were sequentially at a time interval of one second introduced over the surface of the substrate as shown in FIG. 18 and this cycle was repeated 3600 cycles. The thickness and the surface defects of the thin film thus grown were measured. The thickness remained at a constant value of 1.02 μm independently of the concentration of hydrogen chloride introduced. This means that the thickness was increased by 2.83Å during each cycle and corresponds to the thickness of one GaAs molecular layer. Next, as shown in FIG. 19, the surface defect density decreased in response to the introduction of hydrogen chloride. More particularly, in the case of the introduction of arsine not accompanied with hydrogen chloride after the introduction of TMG, the surface defect density is about 600 cm$^{-2}$, but the surface defects are reduced when hydrogen chloride of a molar fraction of less than $5 \times 10^{-5}$ is introduced for a time interval of one second after the introduction of TMG. When the molar fraction of hydrogen chloride is in excess of $1 \times 10^{-4}$, the surface defect density is reduced to about 100 cm$^{-2}$ and remains at a constant value. In view of the above, it is preferable that the molar fraction of hydrogen chloride is in excess of $1 \times 10^{-4}$.

Figure 20:
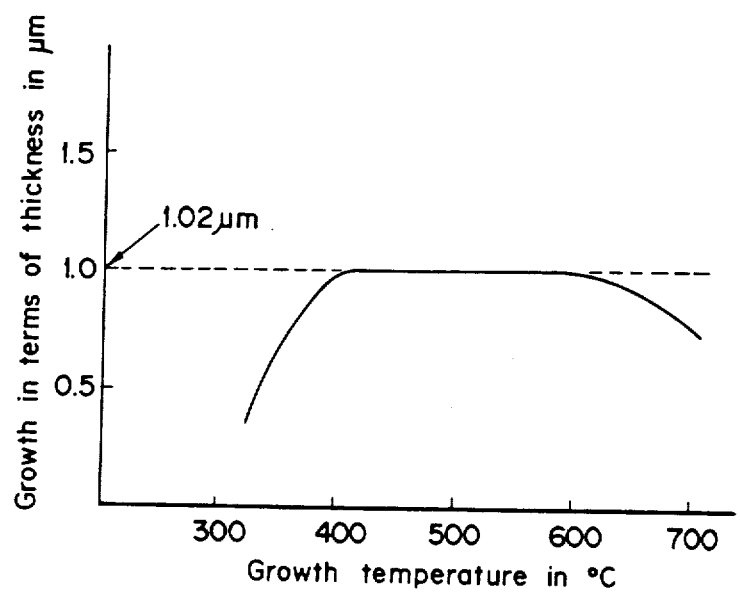
FIG. 20 is a diagram illustrating the dependence of growth on the growth temperature.

The growth temperature (that is, the temperature of the substrate) was varied by the heating device of the apparatus shown in FIG. 6 in order to investigate the influence on growth of the growth temperature. The hydrogen flow rate was maintained at 10 l/min; the molar fraction of arsine which was forced to normally flow was maintained at $1 \times 10^{-5}$; the molar fraction of arsine which was intermittently introduced was maintained at $1 \times 10^{-3}$; the molar fraction of trimethyl gallium was maintained at $1 \times 10^{-4}$; and the molar fraction of hydrogen chloride was maintained $1 \times 10^{-4}$. The introduction time interval of these source gases was one second as shown in FIG. 18. The growth in terms of thickness after 3600 cycles is shown in FIG. 20. When the growth temperature is 300° C., no growth is observed, but when the growth temperature exceeds 350° C., the thickness becomes about 1 μm. When the growth temperature is within a range between about 400° C. and about 600° C., the growth in terms of thickness becomes 1.02 μm which corresponds to the thickness of a single GaAs molecular layer per cycle. However, when the growth temperature rises above 600° C., the growth is decreased. In view of the above, it is preferable that the growth temperature is 400°-600° C.

Referring back to FIG. 18, t$_4$ is a time interval required for purging an excess quantity of hydrogen chloride so that it can be eliminated. On the other hand, a purging period may be assigned immediately after the introduction (t$_1$) of arsine with the second concentration and after the introduction (t$_2$) of trimethyl gallium. Then, it becomes possible to flow only a small quantity of AsH$_3$ diluted with hydrogen to the first concentration in the purging periods.

A GaAs film was grown over the (100) surface of a GaAs substrate. The growth temperature was maintained at 450° C.; the molar fraction of arsine which was forced to normally flow was maintained at $1 \times 10^{-5}$; and one cycle consisted of one second introduction of arsine of a molar fraction of $1 \times 10^{-3}$; one second introduction of trimethyl gallium of a molar fraction of $1 \times 10^{-4}$, and one second introduction and one second interruption of hydrogen chloride with a molar fraction of $1 \times 10^{-4}$. After 3600 cycles, the thickness of the grown GaAs film was measured in the longitudinal direction of the substrate and the result was substantially similar to that shown in FIG. 12.

The film was uniformly formed over the whole surface of the substrate and had a uniform thickness. The growth in terms of thickness per cycle was 2.83Å which indicates that the growth of a single GaAs molecular layer was realized. The thickness was in proportion to the number of cycles repeated and the same result as shown in FIG. 13 was obtained. It is estimated that the growth in terms of thickness per cycle is 2.83Å which indicates single molecular layer growth due to the growth of the single atomic layers.

The carrier concentration measured from the electric characteristics of the grown layer was p-type $10^{17}$ cm$^{-3}$ and a purity was increased by the factor of two as compared with thin films grown by conventional methods. This indicates that a thin film which is being grown is always surround with an AsH$_3$ atmosphere so that the evaporation of As from the crystal is prevented and consequently there exists no vacancy for receiving a carbon acceptor. In addition, the methyl radicals resulting from the thermal decomposition of trimethyl gallium are reduced by hydrogen to become methane which is hardly trapped by the crystal.

When triethyl gallium is used instead of trimethyl gallium, the electric property of the grown layer becomes n-type $10^{14}$ cm$^{-3}$, thereby further improving purity.

Figure 21A:
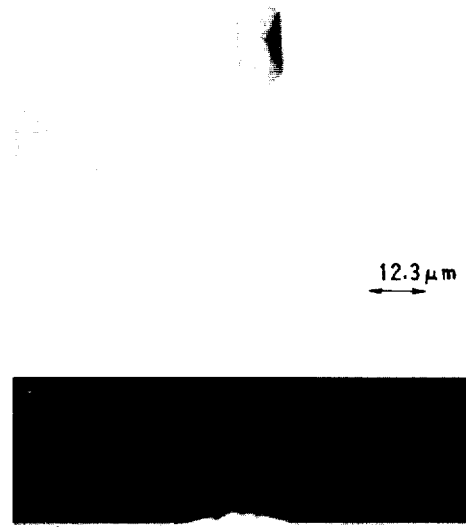
FIG. 21A shows the surface defects of a GaAs epitaxial layer formed without the introduction of hydrogen chloride.
Figure 21B:
FIG. 21B is an optical microscopic picture illustrating the surface defects of a cleavage surface thereof.
Figure 21C:
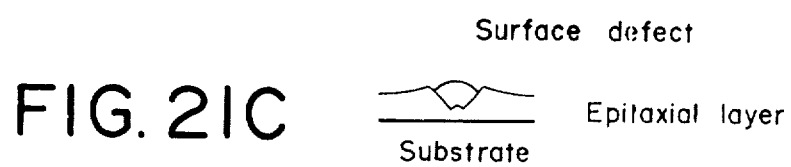
FIG. 21C is a view used to explain FIG. 21B.

Next, the effect of reducing the surface defects by the introduction of hydrogen chloride will be described. As described above, when trimethyl gallium is introduced, a two-layer structure of Ga-Ga is partially formed. When arsine is introduced without being accompanied by hydrogen chloride to form an As layer, anti-site defects result, defining a deep level because Ga in the second layer occupies the position of As. The anti-site defects cause abnormal defects which are observed as surface defects. FIGS. 21A-21C show the surface defects observed at the surface of a GaAs epitaxial layer (2.03 μm in thickness) obtained when the temperature of a substrate was maintained at 450° C.; the hydrogen flow rate was maintained at 10/1 min; the molar fraction of arsine which was forced to normally flow was maintained at $1 \times 10^{-5}$; the molar fraction of trimethyl gallium was maintained at $1 \times 10^{-4}$; the molar fraction of arsine was maintained at $1 \times 10^{-3}$ and when a cycle consisting of alternate introduction for one second of trimethyl gallium and rich arsine was repeated 7200 times. FIG. 21A is an optical microscopic photograph of the surface of the epitaxially grown layer (×811); FIG. 21B shows an optical microscopic photograph (×2040) of a cleavage surface thereof; and FIG. 21C is a view used to explain FIG. 21B.

This surface defect was caused by the abnormal growth due to the anti-site defect.

Figure 22:
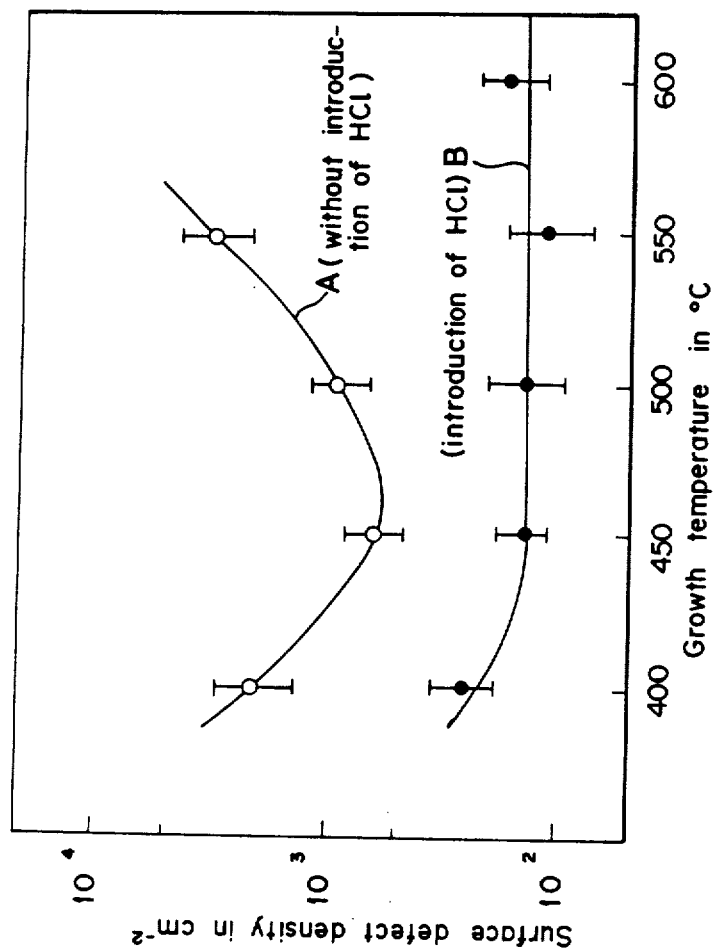
FIG. 22 is a graph illustrating the relation between the surface defect density of a grown layer and the growth temperature when hydrogen chloride is introduced and is not introduced.

When hydrogen chlorine is introduced after the introduction of trimethyl gallium, Gas in the second layer of the two-layer structure of Ga-Gas is combined with Cl so that the two-layer structure is eliminated and consequently the surface defects and deep levels are reduced. FIG. 22 shows the comparison between the surface defect densities of GaAs epitaxial layers (A) and (B). The layer (A) was grown by the method described above with reference to FIG. 21 in which the substrate temperature was varied; that is, the method in which no hydrogen chloride is introduced after the introduction of trimethyl gallium. The layer (B) was grown under the same conditions as described above except that hydrogen chloride of a molar fraction of $1 \times 10^{-4}$ was introduced for a time interval of one second after the introduction of trimethyl gallium. The surface defect densities were measured by observing the surfaces of the GaAs layers (A) and (B) through an optical microscope. As is apparent from FIG. 22, the number of surface defects of the GaAs layer grown by introducing hydrogen chloride is about 1/10 of the number of surface defects of the GaAs layer grown without the introduction of hydrogen chloride over the whole growth temperature range. A noteworthy feature is that the number of surface defects will not increase until the growth temperature rises above 600° C.

Figure 23:
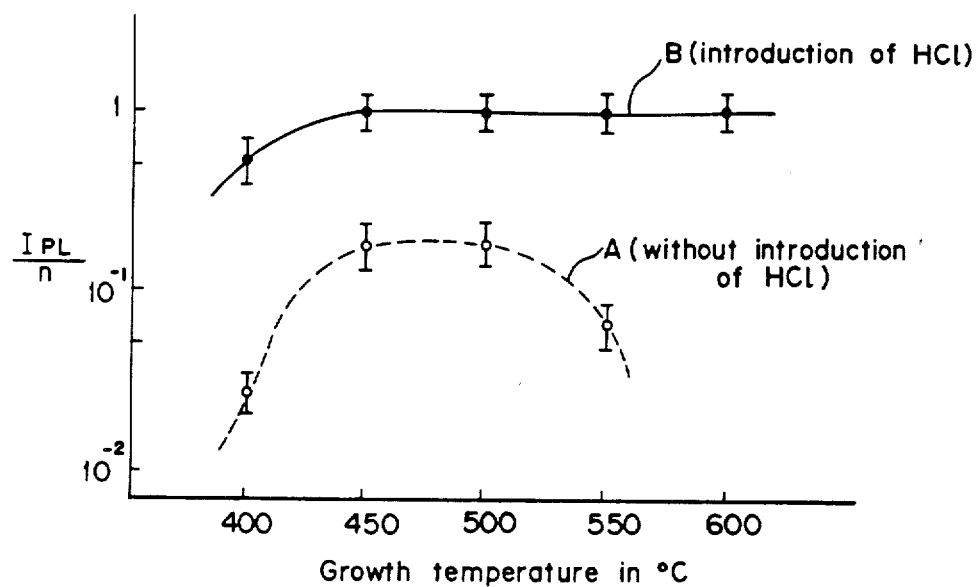
FIG. 23 is a graph illustrating the relation between the photoluminescence intensity and the growth temperature when hydrogen chloride is introduced and when no hydrogen chloride is introduced.
Figure 24:
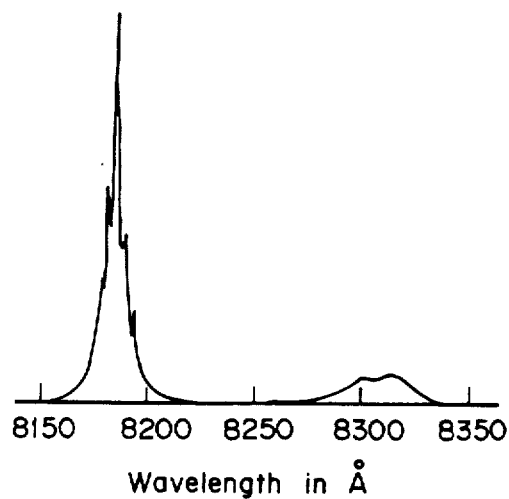
FIG. 24 is a photoluminescence spectrum of a GaAs epitaxial thin film grown by a method of the present invention.

The deep level which is associated with the surface defects traps minority carriers in the epitaxially grown GaAs layer so that their life time is shortened. As a result, the photoluminescence intensity is decreased. FIG. 23 shows the photoluminescence intensities measured when an argon-ion laser beam was irradiated at room temperature on a GaAs film (A) grown without the introduction of hydrogen chloride and on a GaAs film (B) grown by introducing hydrogen chloride. The GaAs layers were grown under the same conditions as described above with reference to FIG. 22. The photoluminescence intensity is normalized in terms of a carrier concentration n. The relative intensity is plotted along the ordinate and the unit of intensity is photoluminescence intensity of a GaAs layer which is fabricated by the liquid-phase epitaxial method and which is considered to have the best crystal properties among the epitaxially grown GaAs layers available at present. It is seen from FIG. 23 that the photoluminescence intensity of the GaAs layer grown by introducing hydrogen chloride is more than 50 times as high as that of the GaAs layer grown without the introduction of hydrogen chloride. When the growth temperature is in excess of 450° C., the photoluminescence intensity becomes substantially equal to that of a layer grown by the liquid-phase epitaxial method. This shows that the GaAs film grown by the method of the present invention exhibits perfect crystal properties. FIG. 24 shows an example of photoluminescence intensity at 4.2K of a GaAs epitaxial layer grown by introducing hydrogen chloride under the same conditions as described above with reference to FIG. 21 except that the growth temperature was maintained at 550° C.

EXAMPLE 6

In addition to GaAs films III-V compound semiconductor thin films, were grown.

Trimethyl aluminum $(CH_3)_3Al$ and arsine $AsH_3$ were used as source gases and AlAs thin films were grown on the (100) surface of AlAs substrates. The introduction of source gases was substantially similar to that described above with reference to FIG. 18 except that TMG was replaced by TMA (of a molar fraction of $1 \times 10^{-4}$). The concentrations of $AsH_3$ and HCl were the same and the introduction time intervals of $AsH_3$ and HCl were the same and the introduction time intervals $t_1$-$t_4$ were one second, respectively. The growth in terms of thickness of a thin film grown at 450° C. after 3600 cycles was 1.02 μm and a single AlAs molecular layer was formed during each cycle.

In order to grow a GaP film, phosphine $PH_3$ may be used as a hydride while trimethyl gallium TMG may be used as an organometallic compound. Under the conditions that $PH_3$ was maintained at a first concentration (at a molar fraction of $1 \times 10^{-5}$) and at a second concentration (at a molar fraction of $1 \times 10^{-3}$); TMG was maintained at a molar fraction of $1 \times 10^{-4}$; and hydrogen chloride was maintained at a molar fraction of $1 \times 10^{-4}$, a thin film was grown over the (100) surface of a GaP substrate by repeating the source gas introduction cycle (in which each source gas was introduced for a time interval of one second as in the case of the growth of the AlAs thin film) 3600 times at the growth temperature of 450° C. The growth in terms of thickness was 0.98 μm and it was observed that a single GaP molecular layer was formed during each cycle.

By using trimethyl indium $(CH_3)_3In$ (at a molar fraction of $1 \times 10^{-4}$) and stibine $SbH_3$ (at a molar fraction of $1 \times 10^{-5}$ and at a molar fraction of $1 \times 10^{-3}$), a thin film was grown over the (100) surface of an InSb substrate at the growth temperature of 450° C. by repeating the source gas introduction cycle in the same manner as that in the growth of the abovedescribed GaP thin film for 3600 times. The growth in terms of thickness was 1.17 μm and a single InSb molecular layer was formed during each cycle.

In like manner, an AlP thin film can be grown by using $(CH_3)_3Al$ and $PH_3$; an AlSb thin film, by using $(CH_3)_3Al$ and $SbH_3$; a GaSb thin film, by using $(CH_3)_3Ga$ and $SbH_3$; an InP thin film, by using $(CH_3)_3In$ and $PH_3$ and an InAs thin film, by using $(CH_3)_3In$ and $AsH_3$. After the growth of 3600 cycles, the AlP thin film was 0.98 μm in thickness; the AlSb thin film was 1.10 μm in thickness; the GaSb thin film was 1.10 μm in thickness; the InP thin film was 1.06 μm in thickness; and the InAs thin film was 1.09 μm in thickness. In any case, the thin film was grown uniformly over the whole surface of the substrate and was free from vacancies of V Group elements, thus excluding carbon acceptors.

As in the case of the growth of GaAs films, when triethyl gallium, triethyl aluminum or triethyl indium is used as an organometallic compound, crystals with a higher degree of purity can be grown.

The effects of the growth temperature and the concentration of the source gases are substantially similar to those attained in EXAMPLE 5. Because of the introduction of hydrogen chloride after the introduction of an element in Group III, III-V compounds which were free from surface defects and had deep levels and high quality crystal properties were obtained.

EXAMPLE 7

The present invention can be equally applied to the growth of II-VI compound semiconductors.

By using dimethyl zinc $(CH_3)_2Zn$ as an organometallic compound while using hydrogen sulfide $H_2S$ as a hydride, a ZnS thin film was grown over the (100) surface of an ZnS substrate. The growth temperature was maintained at 450° C.; the hydrogen carrier gas flow rate was maintained at 10 l/min; the molar fraction of $H_2S$ which was forced to normally flow was maintained at $1 \times 10^{-5}$; the molar fraction of $H_2S$ for growing a single S atomic layer was maintained at $1 \times 10^{-3}$; the molar fraction of $(CH_3)_2Zn$ was maintained at $1 \times 10^{-4}$; and the molar fraction of hydrogen chloride was maintained at $1 \times 10^{-4}$. The introduction time interval of each source gas was one second as shown in FIG. 18. After 3600 cycles, the thickness of the grown thin film was 0.97 μm and the increase in thickness per cycle corresponded to a single molecular layer.

By using dimethyl zinc $(CH_3)_2Zn$ and $H_2Se$, a ZnSe thin film was grown over the (100) surface of a ZnSe substrate. The growth temperature was maintained at a 450° C.; the hydrogen flow rate was maintained at 10 l/min; the molar fraction of $H_2Se$ which was forced to normally flow was maintained at $1 \times 10^{-5}$; the molar fraction of $H_2Se$ for forming a single Se atomic layer was maintained at $1 \times 10^{-3}$; the molar fraction of $(CH_3)_2Zn$ was maintained at $1 \times 10^{-4}$; and the molar fraction of hydrogen chloride was maintained at $1 \times 10^{-4}$. The source gases were introduced at a time interval of one second. After 3600 cycles, the growth in terms of thickness was 1.02 μm and a single ZnSe molecular layer was formed during each cycle.

By using dimethyl mercury $(CH_3)_2Hg$ as an organometallic compound and $H_2Se$ as a hydride, an HgSe thin film was grown over the (100) surface of an HgSe substrate under the same conditions as those in the growth of the ZnSe film described above. After 3600 cycles, the growth in terms of thickness was 1.10 μm and a single HgSe molecular layer was formed during each cycle.

In every case, the thin film was uniformly grown over the whole surface of the substrate and was free from vacancies of the elements of Group VI, thus almost eliminating carbon impurities, whereby the thin film with a higher degree of purity was obtained. When $(C_2H_5)_2Zn$ or $(C_2H_5)_2Hg$ is used instead of $(CH_3)_2Zn$ or $(CH_3)_2Hg$, the inclusion of carbon impurities can be further reduced.

The effects of the growth temperature and the concentrations of the source gases were substantially similar to those attained in EXAMPLE 5 described above and when hydrogen chloride was introduced after the introduction of an element of Group II, II-VI compound semiconductor thin films having a high degree of crystal properties were obtained.

In EXAMPLES 5-7, the substrates were prepared from a single crystal, but it is understood that polycrystal substrates may be used depending upon kinds and uses of compound semiconductors grown.

EXAMPLE 8

By using the apparatus as shown in FIG. 6, an $Al_{0.5}Ga_{0.5}As$ ternary alloy semiconductor thin film has grown over the (100) surface of a GaAs substrate.

The hydrogen flow rate was maintained at 10 l/min; the molar fraction of arsine which was forced to normally flow was maintained at $1 \times 10^{-5}$; and a cycle consisting of the introduction for a time interval of one second arsine at a molar fraction of $1 \times 10^{-3}$ for growing a single atomic layer; the introduction for a time interval of one second of a mixture gas of trimethyl gallium and trimethyl aluminum (TMA) both at a molar fraction of $5 \times 10^{-5}$; and the introduction and interruption for a time interval of one second, respectively, of hydrogen chloride at a molar fraction of $1 \times 10^{-4}$ was repeated 3600 times at the growth temperature of 450° C. The grown layer was 1.02 μm in thickness and an $Al_{0.5}Ga_{0.5}As$ single molecular film was grown during each cycle. Because of the introduction of hydrogen chloride after the introduction of the mixture gas of TMG and TMA, a ternary alloy crystal thin film free from surface defects was obtained.

EXAMPLE 9

By using arsine $AsH_3$, trimethyl gallium (TMG) and trimetyl aluminum (TMA) as source gases, a compound semiconductor thin film of an $Al_{0.5}Ga_{0.5}As$-GaAs-$Al_{0.5}Ga_{0.5}As$ hetero-structure was grown over the (100) surface of a GaAs substrate.

Figures 25A, 25B:
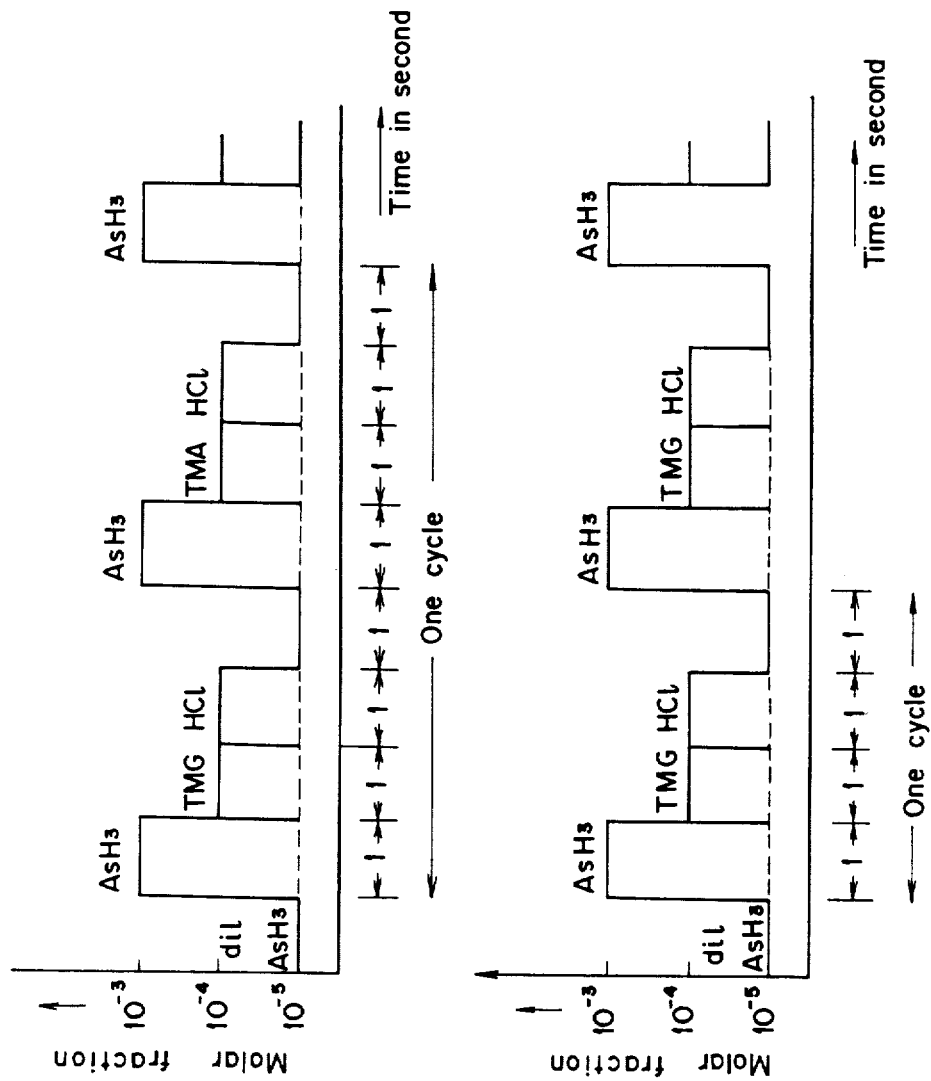
FIGS. 25A and 25B are time charts illustrating the timing for introducing source gases in the case of forming a hetero-structure composed of compound semiconductor.

The hydrogen flow rate was maintained at 10 l/min; the molar fraction of arsine which was forced to normally flow was maintained at $1 \times 10^{-5}$; and arsine, TMG, TMA and hydrogen chloride for forming single atomic layers were maintained at molar fractions of $1 \times 10^{-3}$, $1 \times 10^{-4}$, $1 \times 10^{-4}$ and $1 \times 10^{-4}$, respectively. As shown in FIG. 25A, a cycle consisting of the introduction for a time interval of one second of arsine, the introduction for a time interval of one second of TMG, the introduction for a time interval of one second and the interruption for a time interval of one second of hydrogen chloride, the introduction for a time interval of one second of arsine, the introuduction for a time interval of one second of TMA and the introduction for a time interval of one second of hydrogen chloride was repeated 100 times and a cycle which consists of the introduction of arsine, the introduction of TMG and the introduction of hydrogen chloride as shown in FIG. 25B was repeated 10 times. Thereafter, the first-mentioned cycle was repeated further 100 times.

By the above-described process, a hetero-structure which is substantially similar to that shown in FIG. 15 was fabricated and a thin GaAs layer served as a quantum well.

The wavelength of light emitted from the quantum well was 710 nm and the half-width was 6 meV which is extremely narrow as compared with the half-width of 30 meV expected from the surface roughness of one atomic layer at the hetero-interface. This fact shows that the hetero-interface has no surface roughness. In addition, due to the introduction of hydrogen chloride, the defects of the hetero interface can be reduced so that the half-width becomes narrower. Furthermore, because of the decrease of deep levels, the light emitting efficiency is increased.

In the case of a two-dimensional electron gas structure which is fabricated by a conventional method and in which the electrons travel along the hetero-interface, the electrons are scattered by the surface roughness of the hetero-interface so that the mobility is by far lower than a theoretical value. However, in the case of the heterc interface fabricated by the method of the present invention, the scattering of electrons due to the surface roughness of the hetero-interface can be substantially eliminated and especially the roughness of the interface can be decreased due to the introduction of hydrogen chloride so that the two-dimensional electron gas mobility can be remarkably improved.

In addition, according to the present invention, it becomes possible to grow $Al_{0.25}Ga_{0.5}As$ ternary alloy crystals as shown in FIG. 16 in which the atoms are orderly arranged by utilizing the controllability of a single atomic layer. The electrical and optical characteristics of ordered ternary alloy semiconductor thus grown are by far superior to those of the conventional alloy semiconductor in which the atoms in the same periodic Group are statistically randomly arranged. For instance, in the case of a conventional alloy semiconductor, the conduction electrons are scattered by the potential field produced by the atoms arranged randomly so that the mobility is low, but in the case of an ordered ternary alloy semiconductor which is fabricated by the method of the present invention and in which the atoms are arranged orderly, the potential field becomes periodic so that the mobility can be significantly improved. Especially when hydrogen chloride is introduced after the growth of Ga and Al surfaces, disturbance of the potential field can be effectively prevented.

Next, the high concentration doping of III-V compound semiconductor thin films will be described. First the effects or advantages attained from the introduction of a halide will be described.

EXAMPLE 10

Figure 26:
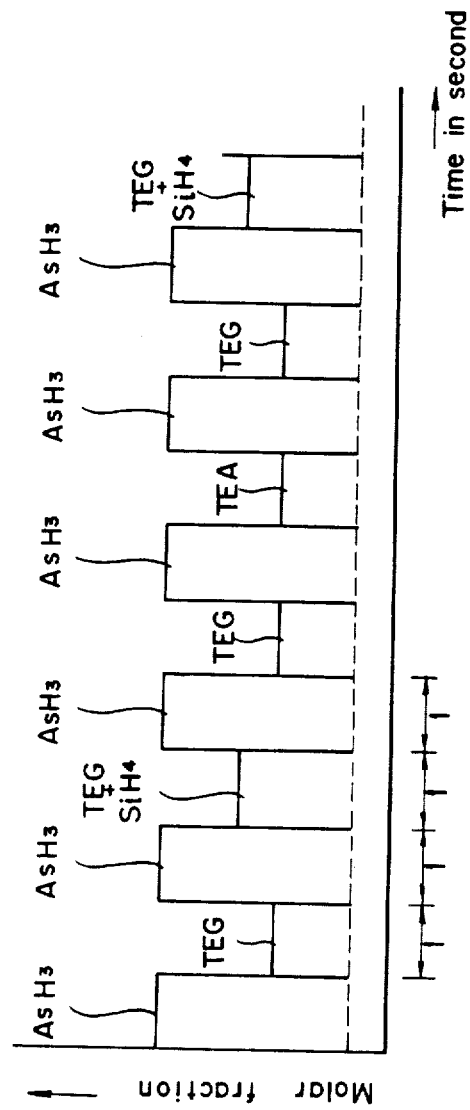
FIG. 26 is a time chart illustrating the timing for introducing source gases.
Figure 27:
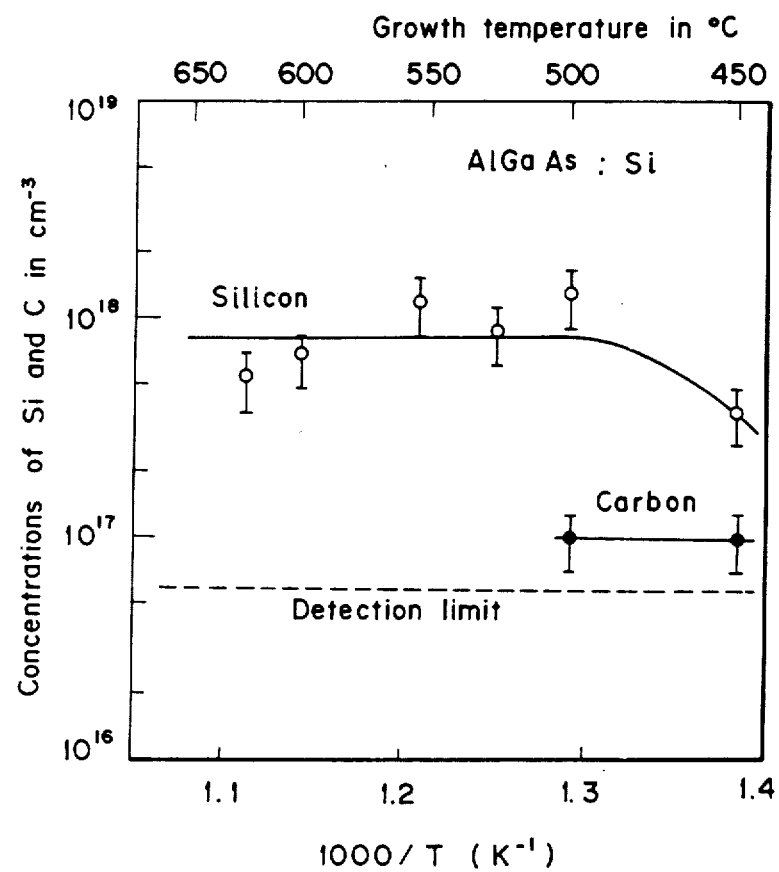
FIG. 27 is a graph illustrating the relation between the growth temperature and the concentration of Si.

A thin GaAlAs ordered ternary alloy semiconductor thin film highly doped with Si was grown in the apparatus shown in FIG. 6. The (100) surface of a GaAs single crystal was used as a substrate; triethyl gallium (TEG), triethyl aluminum (TEA) and arsine ($AsH_3$) were used as source gases; silane ($SiH_4$) was used as a dopant; and hydrogen ($H_2$) was used as a carrier gas. The source gases and the dopant gas were introduced over the surface of the substrate according to the timing chart shown in FIG. 26. That is, three GaAs molecular layers were grown by flowing hydrogen at a rate of 10 l/min, normally flowing arsine at a molar fraction of $1 \times 10^{-5}$ and repeating a cycle consisting of the introduction of arsine at a molar fraction of $1 \times 10^{-3}$ and TEG at a molar fraction of $1 \times 10^{-4}$ at a time interval of one second three times. Thereafter arsine at a molar fraction of $1 \times 10^{-3}$ and TEA at a molar fraction of $1 \times 10^{-4}$ were introduced at a time interval of one second, whereby one AlAs molecular layer was grown. When the three GaAs layer and one AlAs layer are grown alternately in the manner described above, an ordered alloy crystal of $Ga_{0.75}Al_{0.25}As$ can be grown. The fact that the grown thin film was grown by the growth of single molecular layers was confirmed by the correspondence between the number of grown layers and the thickness of the grown film. The fact that the grown crystal is an ordered crystal was confirmed from the results of the analysis of the X-ray diffraction. In order to dope with Si, $SiH_4$ was mixed with TEG when the intermediate layer of the three GaAs layers was grown. The Si concentration in a thin film grown under the conditions that the molar fraction of $SiH_4$ was maintained at $2.5 \times 10^{-7}$ and the growth temperature was varied was measured by a secondary ion mass spectrometer. The results are shown in FIG. 27 in which the concentration of carbon which is an impurity resulting from TEG or TEA is also shown. As is seen from FIG. 27, according to the method of the present invention, a high doping concentration or a high Si concentration of about $10^{18}$ cm$^{-3}$ can be attained at a substrate temperature higher than 500° C. Furthermore, no carbon is detected in this films grown in the above-described growth temperature range.

Figure 28:
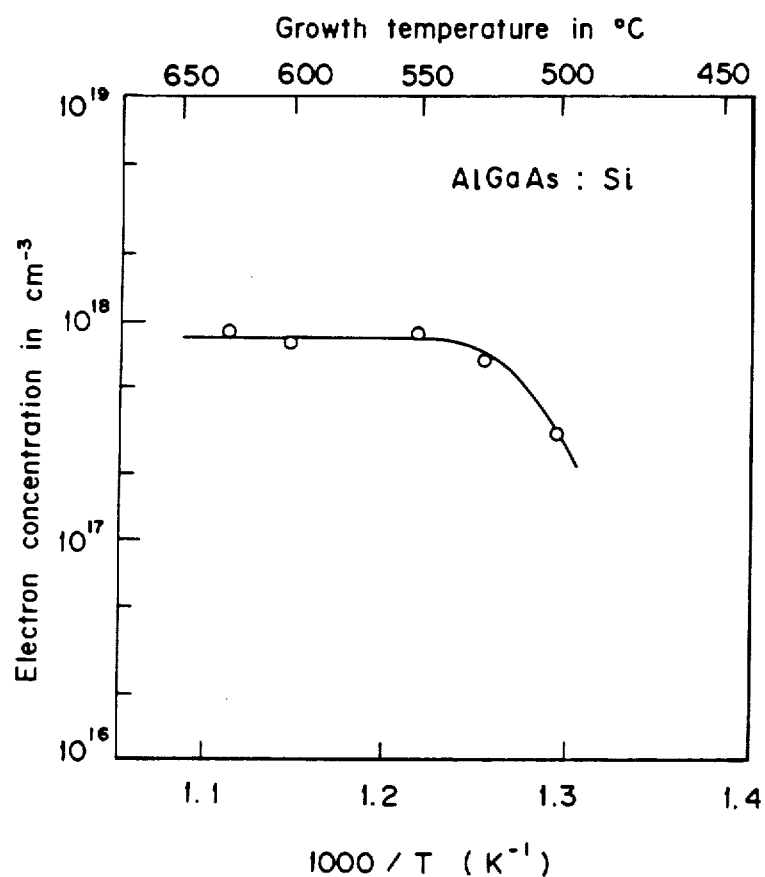
FIG. 28 is a graph illustrating the relation between the growth temperature and the electron concentration.
Figure 29:
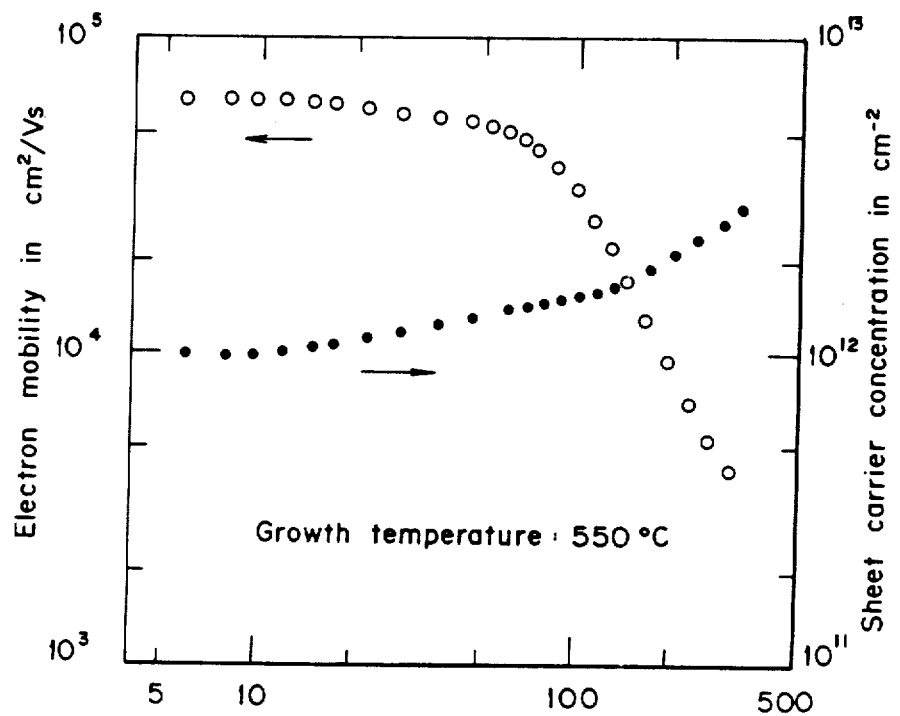
FIG. 29 is a graph illustrating the relation between the temperature and the electron mobility and the sheet carrier concentration.

FIG. 28 shows the carrier concentration at room temperature and FIG. 29 shows the variations in sheet carrier concentration and electron mobility in response to the growth temperature. As shown in FIGS. 27, 28 and 29, according to the method of the present invention, it becomes possible to dope an ordered ternary alloy semincoductor of GaAlAs with Si at such a concentration which is satisfactory in practice, at relatively low processing temperatures from 500° to 650° C.

Figure 30A:
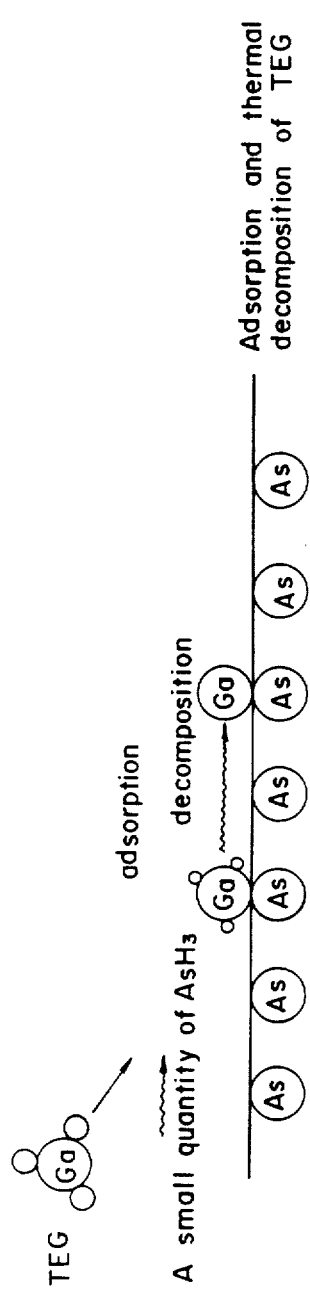
FIGS. 30A, 30B and 30C are views used to explain the underlying principle of the doping according to the present invention.
Figure 30B:
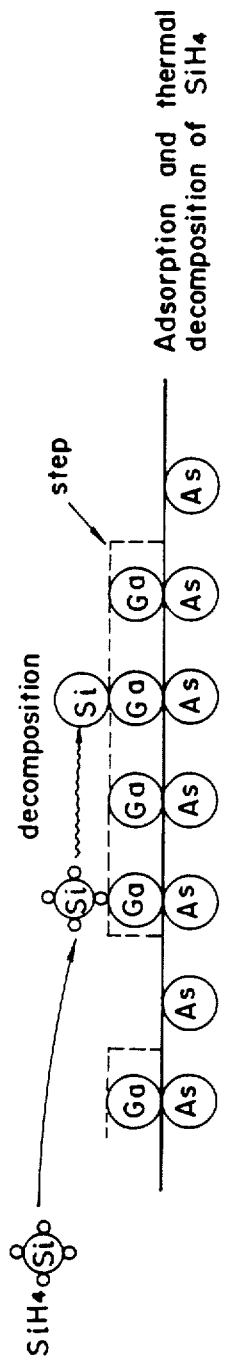
Figure 30C:
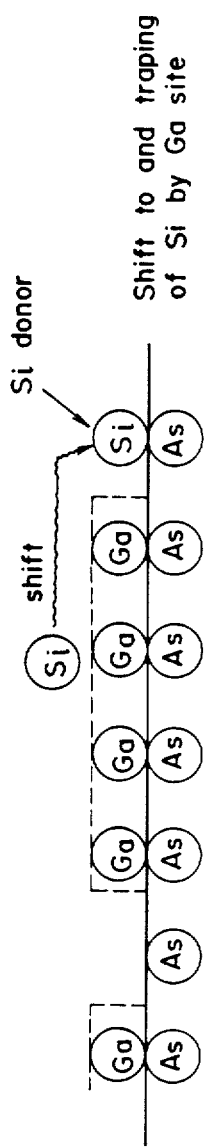

Referring next to FIGS. 30A-30C, the reason why such a high carrier concentration can be attained will be described. When triethyl gallium and silane are simultaneously introduced while an extremely small quantity of arsine which does not contribute to the growth of a thin film is normally flowed, triethyl gallium reaches the surface over which is grown a film and is adsorbed by the As surface so that it is decomposed, freeing Ga atoms. As a result, numerous Ga single atom steps are formed (FIG. 30A). Since silane is concurrently introduced, silane molecules are adsorbed by the Ga atom surface and then decomposed (FIG. 30B). The Si atoms move to the steps and then are trapped by Ga sites, whereby they become doners (FIG. 30C) That is, $SiH_4$ has a tendency to be strongly adsorbed by the Ga surface rather than the As surface and due to the simultaneous introduction of triethyl gallium, Si is trapped by a Ga site before the number of Ga single atom steps is decreased, whereby a high concentration doping can be attained.

EXAMPLE 11

Figure 31:
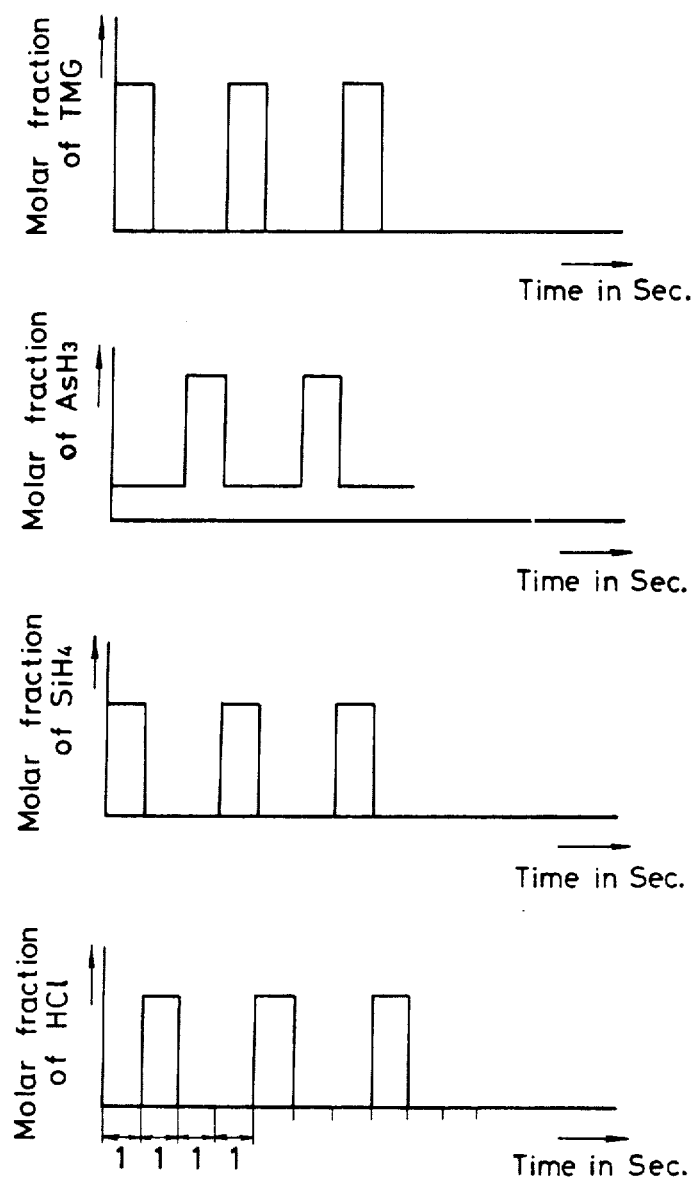
FIG. 31 is a time chart illustrating the timing of the introduction of a source gas.

A GaAs thin film doped with Si was grown over the (100) surface of a GaAs single crystal substrate. Arsine ($AsH_3$) was used as a hydride of Group V; trimethyl gallium $(CH_3)_3Ga$ was used as an organometallic compound containing an element in Group III; and silane $SiH_4$ was used as a hydride containing an element in Group IV. The hydrogen flow rate was maintained at a constant value of 10 l/min and as shown in FIG. 31 arsine at a molar fraction of $1 \times 10^{-5}$ is normally introduced or flowned together with the hydrogen carrier gas. Arsine which is normally forced to flow together with the hydrogen gas serves to prevent the desorption of As from a grown GaAs layer. Therefore, arsine is diluted to such a concentration that it does not react with TMG to produce GaAs. After trimethyl gallium (TMG) and silane both of which have a molar fraction of $1 \times 10^{-4}$ were introduced for a time interval of one second, hydrogen chloride (HCl) at a molar fraction of $1 \times 10^{-4}$ was introduced for a time interval of one second. Thereafter, arsine at a molar fraction of $1 \times 10^{-3}$ was introduced for a time interval of one second. Thus, one cycle was completed and was repeated 3600 times. The grown film was 1μm in thickness.

Figure 32:
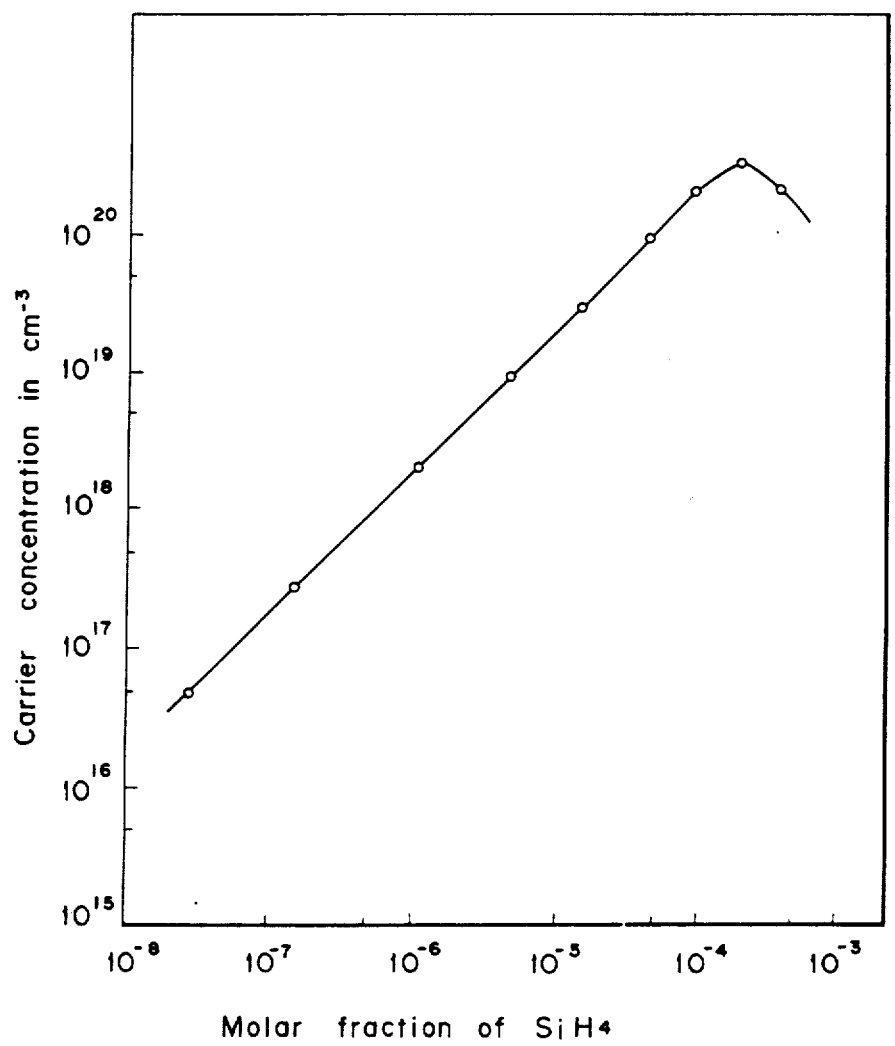
FIG. 32 is a graph illustrating the relation between the molar fraction of silane and the carrier concentration.

FIG. 32 shows the carrier concentrations of the films grown at the growth temperature of 550° C. while the molar fraction of silane was varied from $10^{-8}$ to $10^{-3}$.

Figure 33:
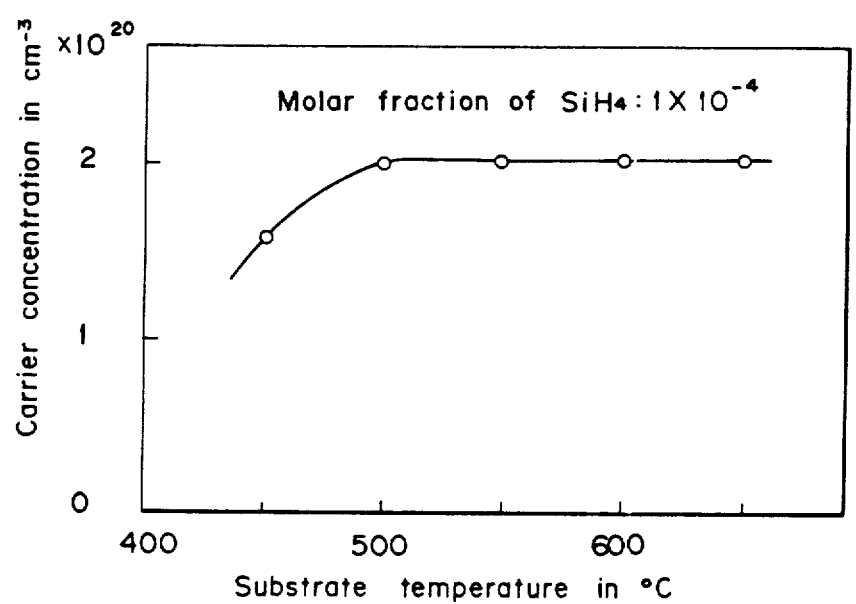
FIG. 33 is a graph illustrating the relation between the substrate temperature and the carrier concentration.

All of the grown layers were of n-type. The carrier concentration is in proportion to a molar fraction ranging from $10^{-8}$ to $10^{-4}$ and a maximum carrier concentration of $3 \times 10^{20}$ cm$^{-3}$ was obtained at a molar fraction of $2 \times 10^{-4}$. FIG. 33 shows the carrier concentratrons obtained when the molar fraction of silane was maintained at $1 \times 10^{-4}$ while the substrate temperature was varied from 450° to 650° C. The carrier concentration of $2 \times 10^{20}$ cm$^{-3}$ which is independent upon the growth temperature was obtained at temperatures between 500° and 650° C. The reason why such high carrier concentration can be obtained has been already explained in EXAMPLE 10.

Figure 34:
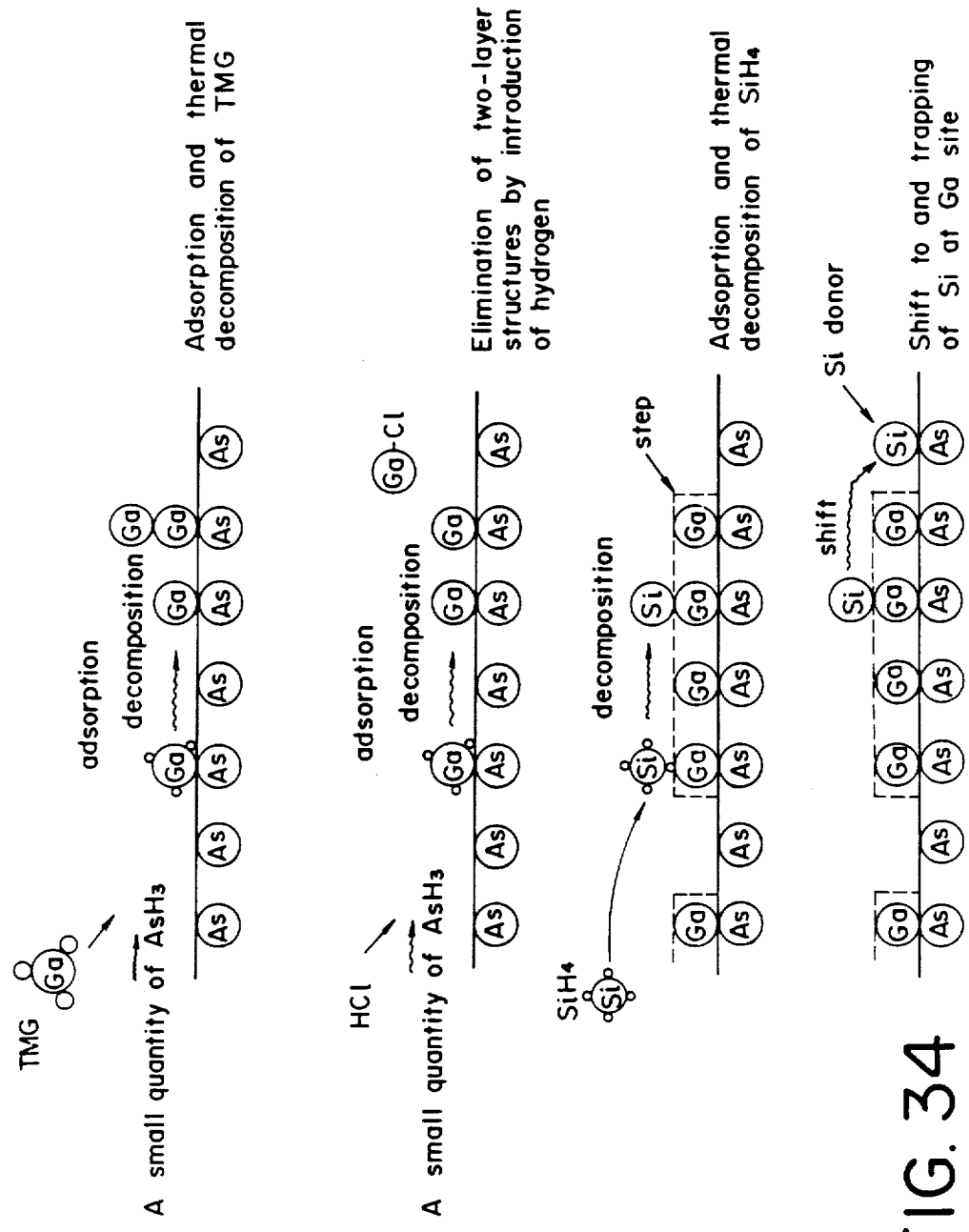
FIG. 34 is a view used to explain the effect of the introduction of HCl.

Next, the effects of the introduction of HCl will be described. When TMG and silane are introduced to grow a Si-doped Ga layer, a part of the Ga atoms forms two-layer structures as shown in FIG. 34. When arsine is introduced over the two-layer structures to grow an As layer without introduction of hydrogen chloride, anti-site defects result and deep levels are defined because Ga in the second layer occupies the position of As. The anti-site defects cause abnormal defects which are observed as surface defects. However, when hydrogen chloride is introduced after the introduction of trimethyl gallium, Ga in the second layer of the Ga-Ga two-layer structure combines with Cl so that the two-layer structure is eliminated. As a result, the number of surface defects and a deep levels can be reduced to less than 1/10. The results of the investigation of the relation between the molar fraction of hydrogen chloride and the surface defect density showed that the effective hydrogen chloride concentration is in excess of a molar fraction of $1 \times 10^{-4}$. It is preferable that the molar fraction of arsine which is forced to normaly flow be less than $4 \times 10^{-5}$. In addition, it is preferable that the molar fractions of TMG and arsine for growing a crystal be in excess of $1 \times 10^{-4}$ and $1 \times 10^{-3}$, respectively, so that the single-molecular-layer growth may be ensured.

Figure 35:
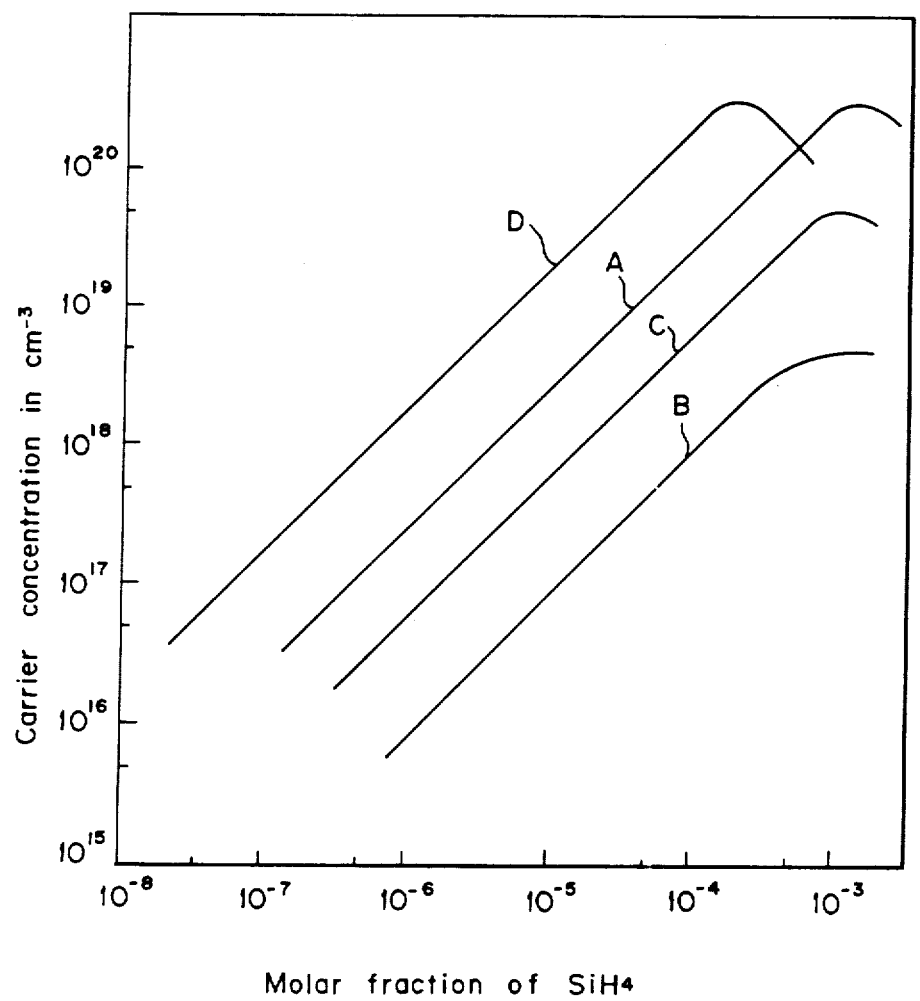
FIG. 35 is a graph illustrating the relation between the molar fraction of silane and the carrier concentration.

The doping quantities when the silane introduction timing is varied were investigated. That is, the introduction of silane was varied as follows. (A) Silane was introduced for one second immediately after the introduction of TMG; (B) silane was introduced for one second immediately after the introduction of arsine; and (C) silane was introduced with the small quantity of arsine which is forced to normally flow through the process chamber. The concentrations of TMG, arsine and hydrogen chloride and their introduction cycle were similar to those described above while substrate temperature was maintained at a constant value of 550° C. FIG. 35 shows the carrier concentrations when the molar fraction of silane was varied. The curve A indicates the carrier concentration obtained when silane was introduced immediately after the introduction of TMG; the curve B indicates the carrier concentration when silane was introduced immediately after the introduction of arsine; and the curve C indicates the carrier concentration when silane was normally flowed through the process chamber. For the sake of comparison, the curve D indicates the carrier concentration when TMG and silane were simultaneously introduced. As a whole, there exists a common feature that the carrier concentration maintains a linear relation with the molar fraction of silane over a relatively wide range. This shows that the carrier concentration can be controlled with a high degree of accuracy. The results of the comparisons among the characteristic curves A-D show that the highest carrier concentration can be obtained as indicated by the curve D when TMG and silane are concurrently introduced; that second highest carrier concentration is obtained when silane is introduced immediately after the introduction of TMG (the curve A); and the carrier concentration decreases in the order of when silane is always introduced (curve C) and when silane is introduced immediately after the introduction of arsine (curve B). In the case of the curve A, silane is introduced after the growth of the Ga layer so that the number of steps on the Ga surface is less than that of curve D. As a result, the Ga surface traps less Si. When the molar fractions of silane are same, the carrier concentration is lower than that indicated by the curve D. In the case of the curve C, Si which is trapped by the As layer functions as an acceptor which cancels the Si donor trapped in the Ga layer so that the carrier concentration drops as a whole. In general, it is difficult for Si to enter an As site, but in the case of the growth of the As surface, As steps are formed over the surface of a single atomic layer so that the probability that Si is trapped at an As site is increased, resulting in an increase of acceptors. However, even in this case, a large quantity of Si is trapped by the Ga surface so that the carrier concentration of $5 \times 10^{19}$ cm$^{-3}$ which is higher by a factor of one as compared with the carrier concentrations attained by the conventional methods can be obtained. The maximum carrier concentration attainable by introducing silane immediately after the introduction of arsine, thereby doping the As surface with Si is of the order of $5 \times 10^{18}$ cm$^{-3}$ as indicated by the curve B.

EXAMPLE 12

Figure 36:
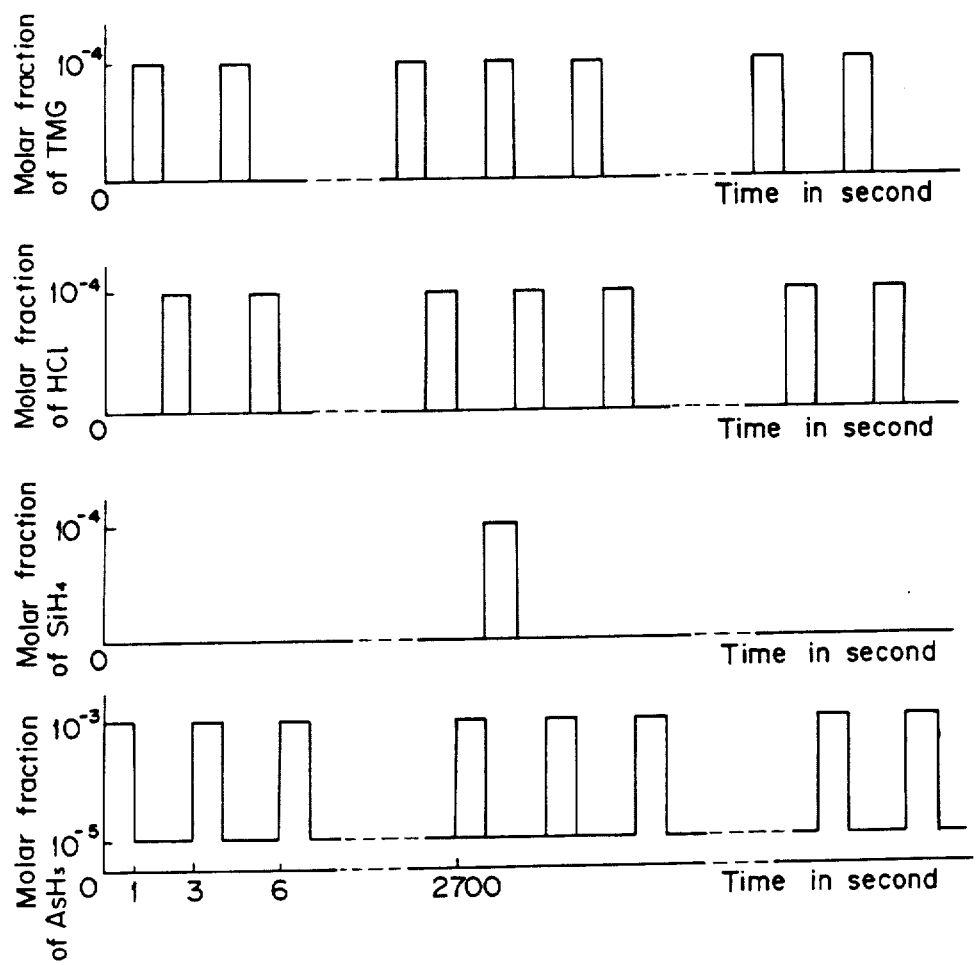
FIG. 36 is a time chart illustrating the timing of the introduction of a source gas.

A GaAs crystal containing only one atomic layer doped with Si was grown. Arsine AsH3 was used as a hydride containing an element in Group V; trimethyl gallium (TMG) (CH3)3Ga was used as an organometallic compound containing an element in Group III; and silane SiH4 was used as a hydride containing an element in Group IV. FIG. 36 shows the timing for introducing each source gas. The flow rate of hydrogen which is a carrier gas was maintained at a constant value of 10 l/min and a small quantity of arsine having a molar fraction of $1 \times 10^{-5}$ was made to normally flow through the process chamber so as to prevent the vaporization of As from a GaAs crystal during the growth of a Ga layer, arsine is diluted to such a low concentration that it does not react with trimethyl gallium to produce GaAs.

Figure 37:
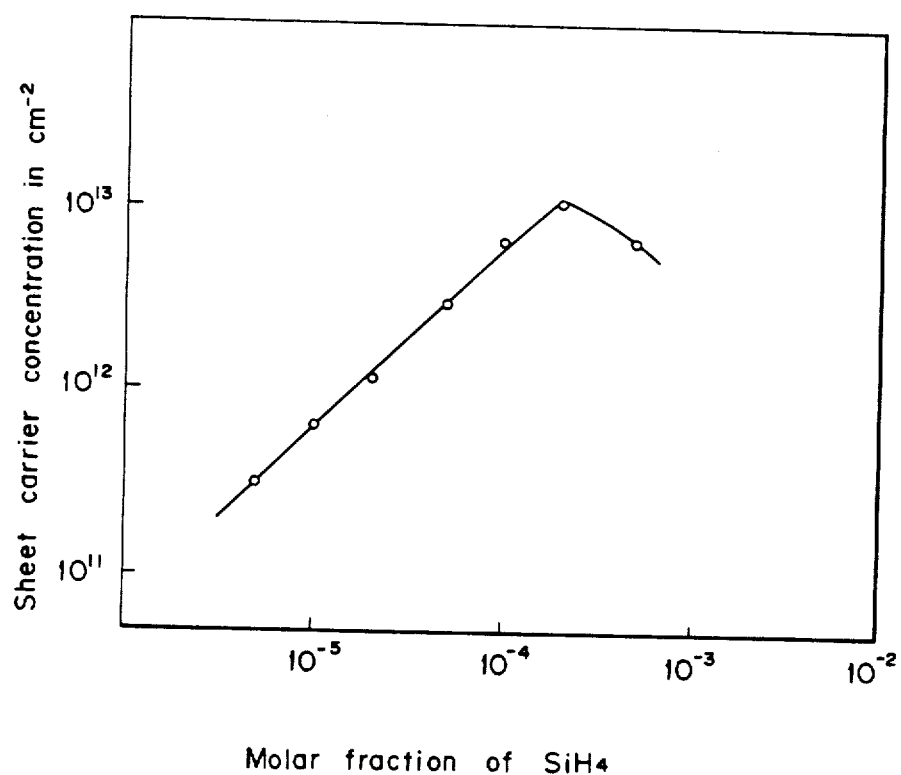
FIG. 37 is a graph illustrating the relation between the molar fraction of silane and the sheet carrier concentration.
Figure 38:
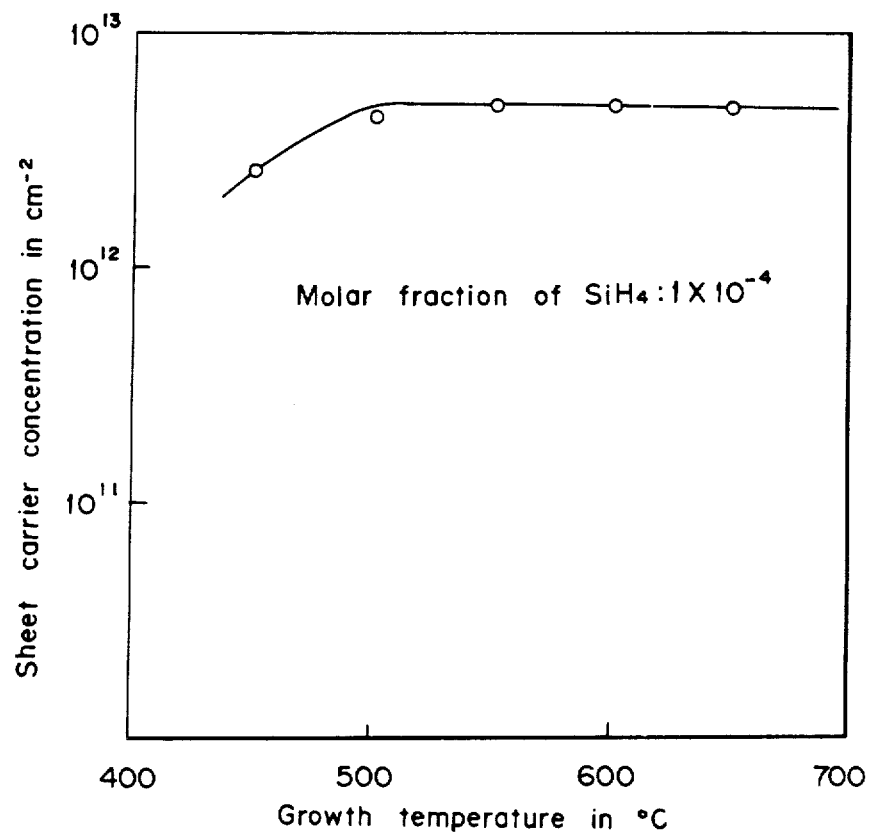
FIG. 38 is a graph illustrating the relation between the growth temperature and the sheet carrier concentration.

A growth cycle consisting of the introduction for a time interval of one second of TMG at a molar fraction of $1 \times 10^{-4}$, the introduction for a time interval of one second of HCl at a molar fraction of $1 \times 10^{-4}$ and the introduction for a time interval of one second of arsine at a molar fraction of $1 \times 10^{-3}$ was repeated 900 times to grow a non-doped GaAs layer. Thereafter, the introduction of TMG was interrupted for a time interval of one second, thereby stabilizing the As surface and then TMG and silane were introduced for a time interval of one second over the stabilized As surface, thereby growing one atomic layer doped with Si. Next, HCl, arsine and TMG were introduced in the order named, whereby a non-doped GaAs layer was grown. FIG. 37 shows the variations in sheet carrier concentration when the growth temperature was maintained at 550° C. while the concentration of silane was varied. The sheet carrier concentration was obtained by the measurement of Hall mobility at room temperature. All the sheet-doped layers were of n-type and when the molar fraction of silane was $2 \times 10^{-4}$, the maximum sheet carrier concentration of $1 \times 10^{13}$ cm$^{-2}$ was obtained. The non-doped GaAs layer had a high degree of purity and a high concentration was obtained by doping Si into the atomic layers. FIG. 38 shows the carrier concentrations obtained when the molar fraction of silane was maintained at a constant value of $1 \times 10^{-4}$ while the growth temperature was varied from 450° C. to 650° C. In the temperature range between 500° C. and 650° C., a sheet carrier concentration of $5 \times 10^{12}$ cm$^{-2}$ which was independent of the growth temperature was obtained. This shows that the same sheet carrier concentration was obtained by using silane whose quantity was less than a fraction of 1/10 of the quantity of silane used in conventional crystal growth methods.

Figure 39:
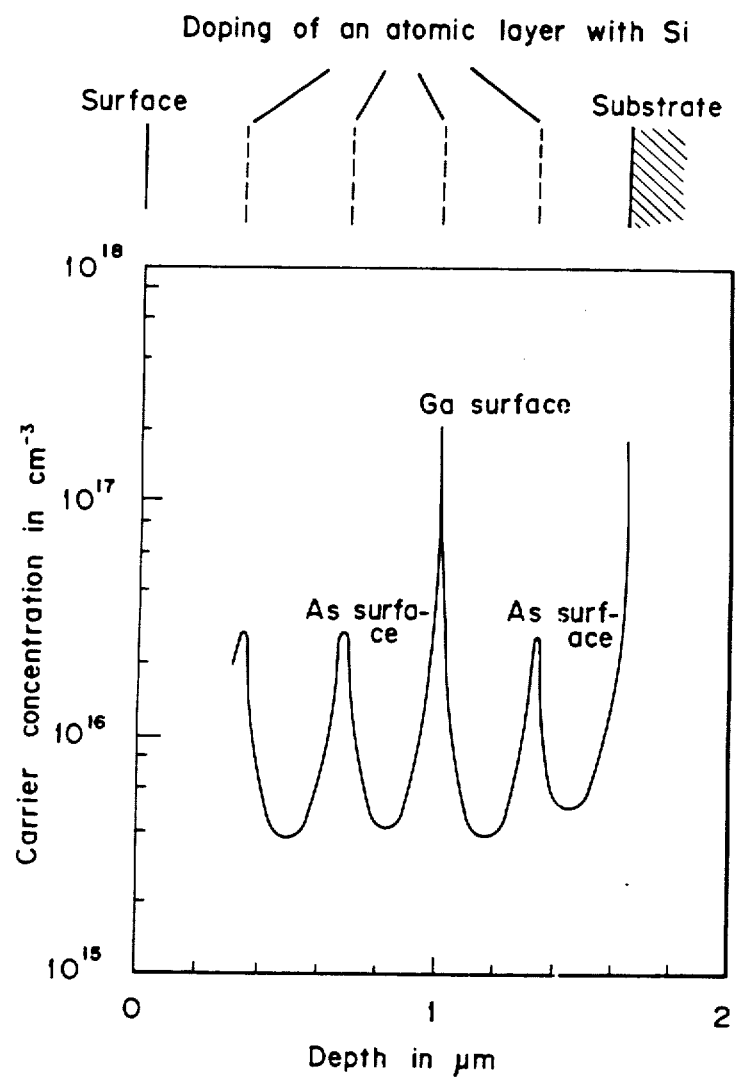
FIG. 39 and FIG. 40 are views illustrating the sheet carrier concentration of the doped surface.
Figure 40:
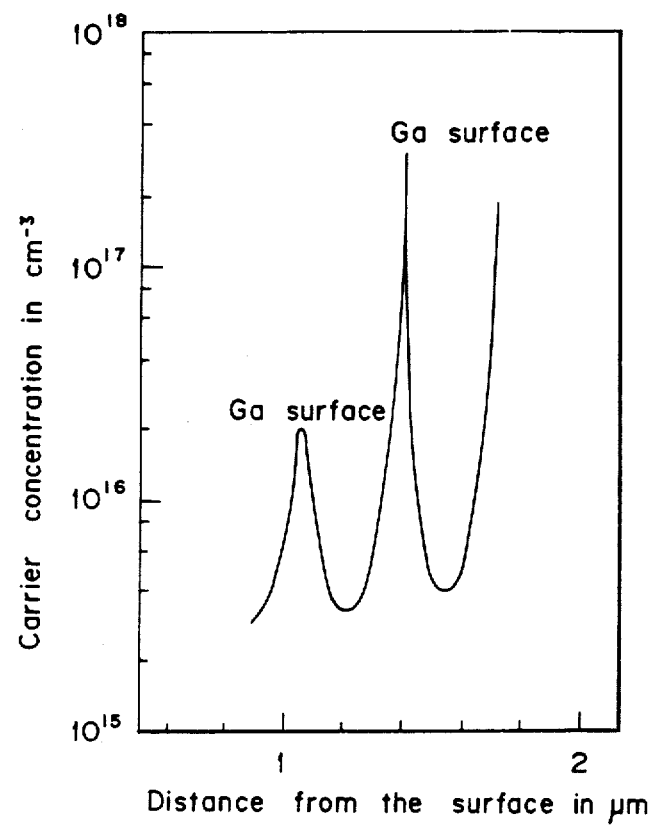

The carrier concentration resulting from the doping of one atomic surface with Si was measured by the Schottkey method. TMG and arsine were used as source gases and a thin GaAs film was grown over the (100) surface of a GaAs substrate by alternately introducing for one second TMG, HCl and highly concentrated arsine while a very small quantity of arsine was normally introduced. The above-described cycle was repeated many times to grow a thin film. Thereafter, silane was introduced for a time interval of one second so as to dope Si into the As surface and then the normal crystal growth cycle was repeated several times to grow a thin film. Thereafter TMG, HCl and silane were introduced in the order named so as to dope the Ga surface with Si and then the cycle for growing a thin film was repeated. FIG. 39 shows carrier concentrations of a thin film in the direction of depth thereof by the Schottkey method. This thin film was grown at the growth temperature of 550° C. by repeating 6000 times a growth cycle consisting of the introduction for a time interval of one second of arsine at a molar fraction of $1 \times 10^{-5}$ and at a molar fraction of $1 \times 10^{-3}$, the introduction for a time interval of one second of TMG at a molar fraction of $1 \times 10^{-4}$ and the introduction for a time interval of one second of HCl at a molar fraction of $1 \times 10^{-4}$, the molar fraction of silane being maintained at $1 \times 10^{-4}$. It is seen that Si is concentrated at the specific surfaces at which Si was impinged. The spread of each peak is due to thermal vibration and the value of the half-width of each peak shows that a thin film was grown by the repeated growth of a single atomic layer. It is also seen that Si atoms are trapped more by the Ga surface rather than the As surface. FIG. 40 shows a comparison as a method for doping Si into a specific Ga surface between the method in which silane and TMG are simultaneously introduced and the method in which silane is introduced after the introduction of TMG. The lower peak corresponds to the surface which is doped with Si by introducing silane after the introduction of TMG while the higher peak corresponds to a surface which is doped with Si by the simultaneous introduction of TMG and silane. It is seen that the quantity of Si doped into the Ga surface is higher than the quantity of Si doped into the As surface in a single atomic surface and a higher carrier concentration can be obtained by the method for forming a Ga surface by the simultaneous introduction of TMG and silane rather than by the method in which silane is introduced after the growth of the Ga surface. These results are basis of the carrier concentration curves shown in FIG. 35.

When HCl is introduced in the process of growing thin films so as to remove Ga from partially formed two-layers in a Ga layer and the Ga layer is doped with Si, a high concentration doped layer with a fairly low surface defect density can be obtained. A high surface defect density is decidedly fatal to the fabrication of GaAs integrated circuits, but when the method of the present invention is applied to the fabrication of GaAs integrated circuits, a high yield can be ensured.

So far, silane has been used as a doping gas, but various doping gases as shown in TABLE 1 may be used to attain a high carrier concentration.

TABLE 1

| doping gas | molar fraction | growth temperature | maximum carrier concentration |
|---|---|---|---|
| Group IV GeH$_4$ | $2 \times 10^{-4}$ | 550° C. | n-type $3 \times 10^{20}$ cm$^{-3}$ |
| Group IV Si(CH$_3$)$_4$ | $2 \times 10^{-4}$ | 550° C. | n-type $3 \times 10^{20}$ cm$^{-3}$ |
| Group VI H$_2$S | $6.5 \times 10^{-5}$ | 550° C. | n-type $3 \times 10^{20}$ cm$^{-3}$ |
| Group VI (CH$_3$)$_2$Te | $6.5 \times 10^{-5}$ | 550° C. | n-type $3 \times 10^{20}$ cm$^{-3}$ |
| Group II (CH$_3$)$_2$Zn | $2 \times 10^{-6}$ | 550° C. | p-type $2 \times 10^{20}$ cm$^{-3}$ |

The present invention may be equally applied to other III-V compounds such as AlAs, InAs, AlP, GaP, InP, AlSb, GaSb, InSb, AlGaAs, InGaAs, AlInAs, AlGaP, InGaP, AlGaSb, InGaSb, InGaAsP, InGaAsSb, AlGaAsP, AlGaAsSb and so on.

EXAMPLE 13

Figure 41:
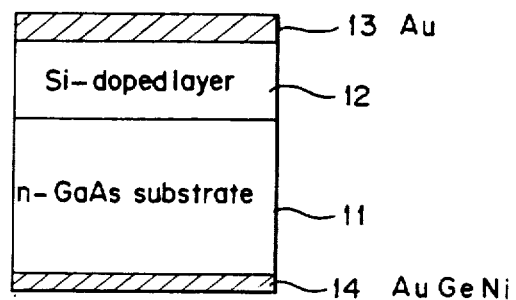
FIG. 41 is a sectional view of a GaAs crystal having a highly doped layer.

A compound semiconductor of the type having a structure as shown in FIG. 41 was grown. An Si-doped GaAs layer 12 250Å A in thickness was grown on a Si-doped n-GaAs substrate 11 (with a carrier concentration of $5 \times 10^{15}$ cm$^{-3}$) in the following manner. The growth temperature was maintained at 450° C. and while arsine which was diluted with hydrogen to a molar fraction of $1 \times 10^{-5}$ was normally flowed through the process chamber, TMG at a molar fraction of $1 \times 10^{-4}$ and silane at a molar fraction of $1 \times 10^{-4}$ were simultaneously introduced for a time interval of one second. Thereafter arsine at a molar fraction of $1 \times 10^{-3}$ was introduced for a time interval of one second. These steps were alternately repeated so that the n-GaAs film 12 with a carrier concentration of $2 \times 10^{20}$ cm$^{-3}$ was grown. As shown in FIG. 41, an Au film 13 was deposited over the Sidoped layer 12 while an AuGaNi alloy electrode layer 14 was deposited over the undersurface of a substrate 11 and the current-voltage characteristic was measured. The specific resistance was less than $5 \times 10^{-8} \Omega \cdot$cm$^{-2}$ which is the lowesr value ever reported.

According to a method of the present invention, the process in the conventional crystal growth method for depositing an electrode metal and heat treating it to produce an alloy can be eliminated and a high-concentration doped layer can be grown as an electrode layer in the crystal growth process. Unlike the surfaces of the electrode layers fabricated by the conventional method, the surface of the electrode layer formed in accordance with the present invention is not roughened.

EXAMPLE 14

Figure 42:
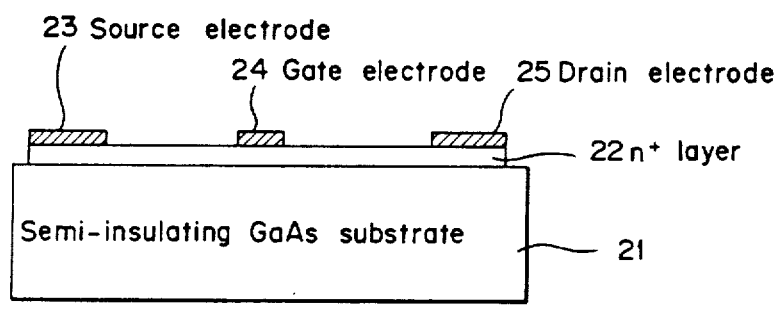
FIG. 42 is a cross sectional view of a GaAs FET structure having a highly doped layer.

The present invention was applied to the fabrication of GaAs FETs. As shown in FIG. 42, over the surface of a semi-insulating GaAs substrate 21 was grown an n$^+$GaAs layer 22, 0.1μm in thickness in a manner substantially similar to that described above in connection with EXAMPLE 13. Thereafter, a source electrode 23, a gate electrode 24 and a drain electrode 25 were formed by the conventional lithographic process. While the conventional method earnes out ion plantation of the n$^+$ layer, the present invention uses a crystal growth method. In addition, according to the present invention, HCl is introduced during the growth process, thereby removing or eliminating the two-layer structures of Ga so that crystal defects in the n+layer are less. Furthermore, according to the present invention, the high-concentration n+ layer is grown so that a depletion layer becomes narrow and consequently the source series resistance is lowered. Moreover, in the case of integration, variations in characteristics of individuals FETs are less and the standard deviation of the pinch-off voltage of FETs is less than 100 mV. As a result, the yield of wafers is significantly improved.

EXAMPLE 15

The present invention was applied to the fabrication of compound semiconductors having a heterostructure.

Figures 43A, 43C:
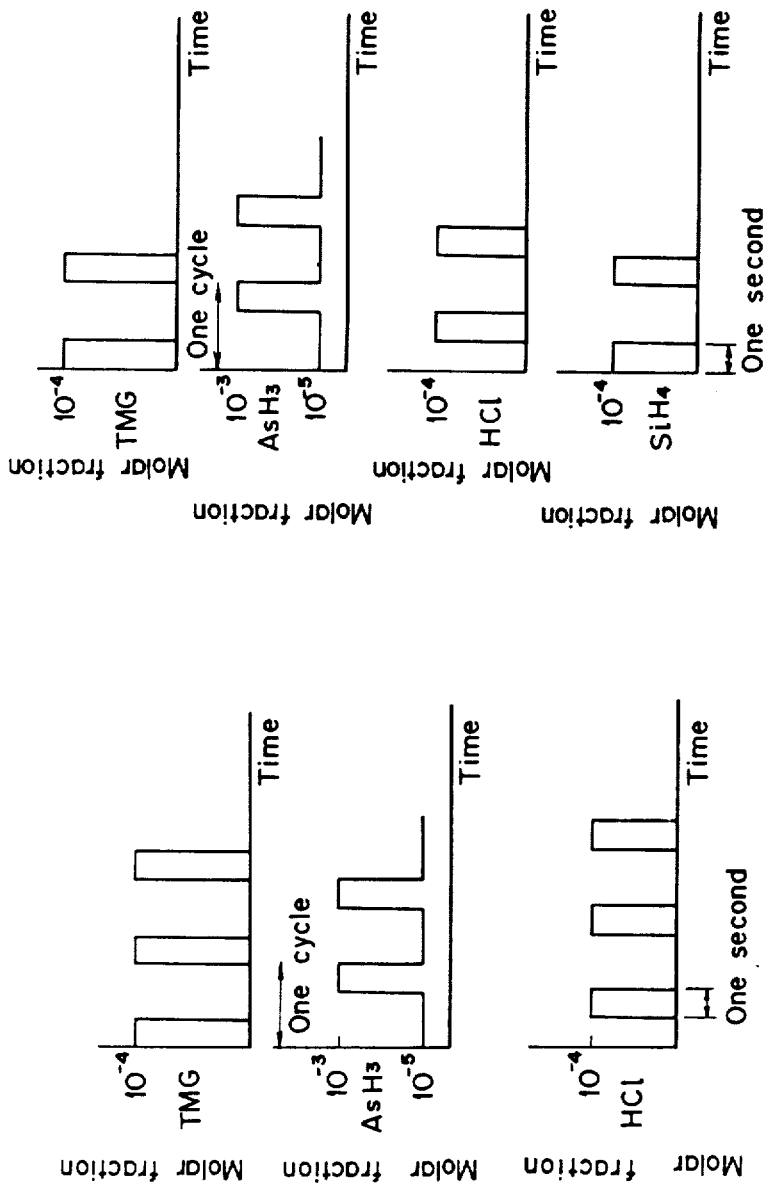
FIGS. 43A, 43B and 43C are time charts each illustrating the timing of the introduction of source gases in order to form a doped compound semiconductor with a ternary alloy hetero-structure.
Figure 43B:
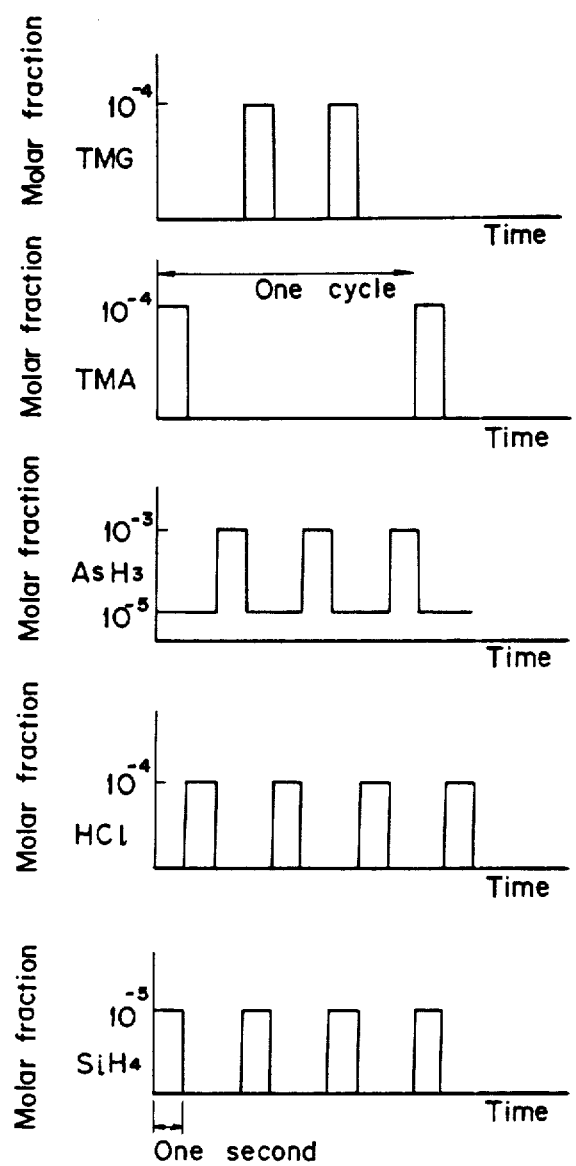
Figure 44:
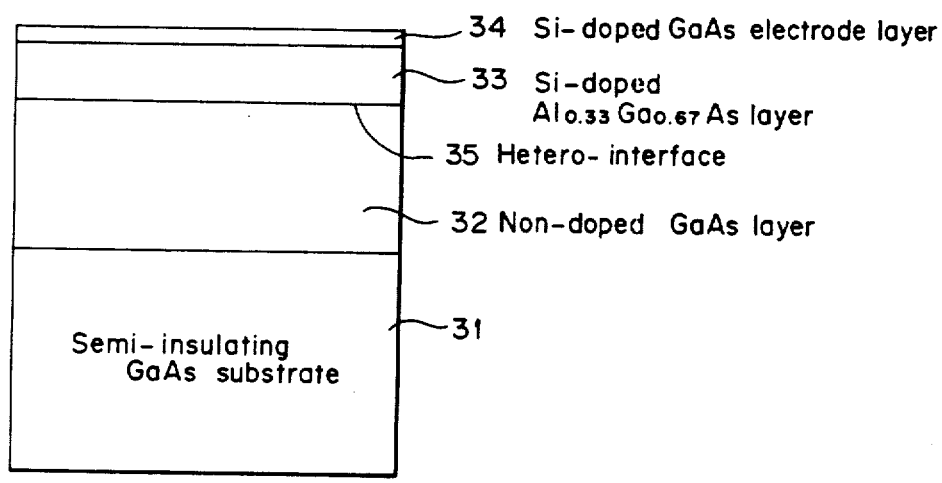
FIG. 44 is a sectional view of a hetero-structure compound semiconductor fabricated by a method of the present invention.

As shown in FIG. 43A, while arsine which was diluted with hydrogen to a molar fraction of $1\times10^{-5}$ was normally flowed through the process chamber, TMG at a molar fraction of $1\times10^{-4}$, HCl at a molar fraction of $1\times10^{-4}$ and arsine at a molar fraction of $1\times10^{-3}$ were alternately introduced to grow a GaAs layer 5000Å in thickness over the (100) surface of a semi-insulating GaAs substrate. The carrier concentration of this GaAs layer thus grown was $5\times10^{-14}$cm$-3$. Thereafter, as shown in FIG. 43B, source gases such as a mixture of TMA and silane, HCl, arsine, a mixture of TMG and silane, HCl, arsine, a mixture of TMG and silane, HCl, arsine and a mixture of TMA and silane were introduced in the order named so that an Si-doped Al$_{0.33}$Ga$_{0.67}$As ordered ternary alloy layer in which two GaAs layers and one AlAs layer alternate was grown over the GaAs layer. The molar fraction of silane was maintained at $1\times10^{-5}$ while the carrier concentration in the ordered alloy layer was maintained at $1\times10^{19}$cm$^{-3}$. Thereafter, as shown in FIG. 43C, the source gases such as (TMG+silane), HCl and arsine were introduced in the order named to grow an Si-doped GaAs layer 50Å in thickness over the Al$_{0.33}$Ga$_{0.67}$As layer. The molar fraction of silane was maintained at $1\times10^{-4}$ while the carrier concentration in the GaAs layer Thus grown was maintained at $1\times10^{20}$cm$^{-3}$. The growth temperature was 550° C. As a result, a heterostructure compound semiconductor in which the non-doped GaAs layer 32, the Si-doped Al$_{0.33}$Ga$_{0.67}$As layer 33 and the Si-doped GaAs layer 34 were grown in the order named over the semi-insulating GaAs substrate 31 was obtained as shown in FIG. 44. The Si-doped Al$_{0.33}$Ga$_{0.67}$As layer 33 functions as a layer for supplying two-dimensional electrons and the interface 35 between the layer 33 and the non-doped GaAs layer 32 becomes a surface along which two-dimensional electron gases move. The Si-doped GaAs layer 34 functions as an electrode.

In case of a FET fabricated from the heterostructure compound semiconductor thus grown, HCl is introduced after the formation of Ga layer so as to eliminate the two-layer structures of Ga so that surface and interface defects become less. As a consequence, the IC yield is improved and the two-dimensional electron gas moves at a high velocity because the hetero-interface is almost free from defects. In addition, the method of the present invention just described above is carried out at a lower crystal growth temperature as compared with the conventional crystal growth methods so the diffusion of Si at the hetero-interface is suppressed and the hetero-interface coincides with the doped interface. As a result, high-speed FETs can be realized without causing the decrease in electron mobility in the GaAs layer. Furthermore, Si can be doped at a high concentration so that an electrode can be formed by the crystal growth.

Figure 45:
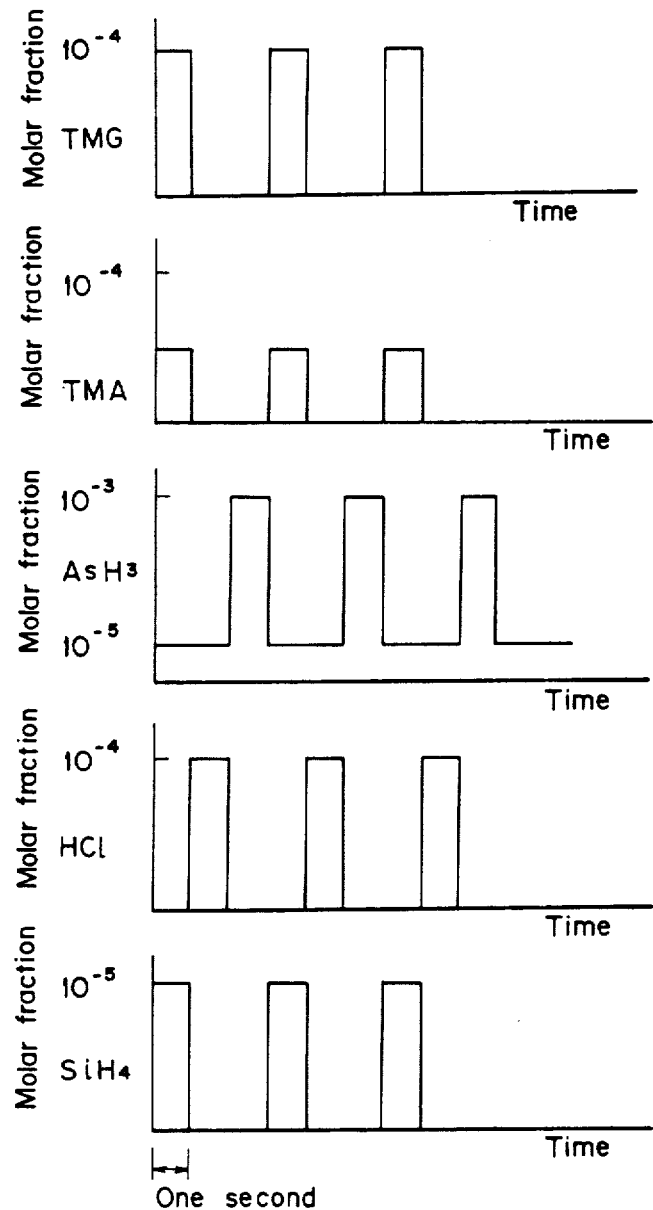
FIG. 45 is a time chart illustrating the timing for introducing source gases during the fabrication of a ternary alloy semiconductor.

Unlike the method as shown in FIG. 43B, in the case of growing an Si-doped Al$_{0.33}$Ga$_{0.67}$As layer, TMG and TMA whose quantity is one half of that of TMG may be simultaneously introduced as shown in FIG. 45. According to this method, it becomes possible to grow a Al$_{0.33}$Ga$_{0.67}$As mixed crystal in which Ga atoms and Al atoms whose quantity is one half of that of Ga atoms are mixed in a single atomic surface. In the case of growing an AlGaAs mixed crystal, the ratio between Al and Ga can be freely selected by varying the number of the Al and Ga surfaces in the case of an ordered mixed crystal or by varying the ratio between TMA and TMG which are simultaneously introduced in the case of a disordered mixed crystal. Unlike the pulse-like introduction of silane as shown in FIGS. 43B and 43C and FIG. 45, silane may be kept flowing for the full period of doping Si.

EXAMPLE 16

Figure 46:
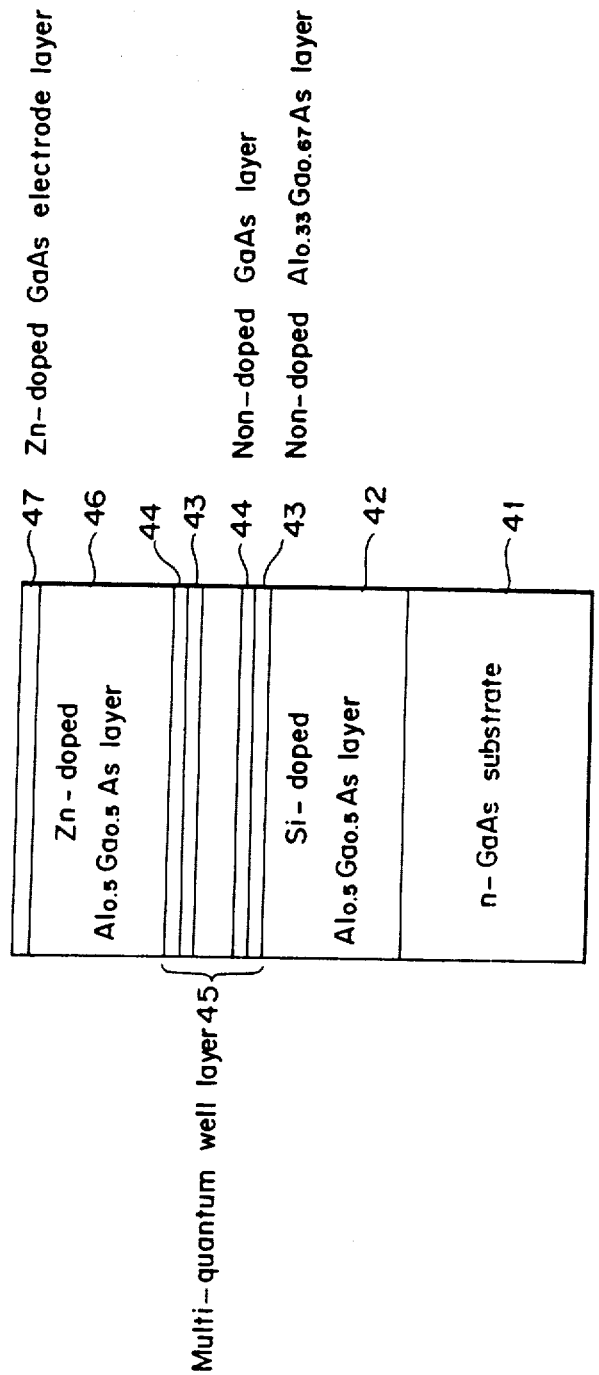
FIG. 46 is a sectional view of a hetero-structure compound semiconductor which is fabricated by a method of the present invention and which is adapted to be used as a multi-quantum-well structured laser.

A hetero-structure compound semiconductor having a structure as shown in FIG. 46 was formed.

An Si-doped Al$_{0.5}$Ga$_{0.5}$As layer 42 having a thickness of 5000Å and a carrier concentration of $2\times10^{18}$cm$^{-3}$ was grown over the (100) surface of an n-GaAs substrate 41 having a carrier concentration of $2\times10^{18}$cm$^{-3}$ in a manner substantially similar to that described above with reference to FIG. 45 except that the molar fractions of TMG and TMA were changed to $1\times10^{-4}$ and the molar fraction of silane was changed to $1\times10^{-6}$. Under the same conditions described above with reference to FIG. 43B or FIG. 45 except that no silane was introduced, a non-doped Al$_{0.33}$Ga$_{0.67}$As layer 43 100Å in thickness was grown and then a non-doped GaAs layer 44, 100Å in thickness was grown. Five non-doped Al$_{0.33}$Ga$_{0.67}$As layers and five non-doped GaAs layers were alternately grown, whereby a multi-quantum well layer 45 is formed. Thereafter, a Zn-doped Al$_{0.5}$Ga$_{0.5}$As layer 46 having a carrier concentration of $5\times10^{19}$cm$^{-3}$ and a thickness of 5000Å was grown. Furthermore, a Zn-doped GaAs layer 47 having a thickness of 100Å and a carrier concentration of $5\times10^{19}$ cm$^{-3}$ was grown. In order to dope with Zn, dimethyl zinc (CH$_3$)$_2$Zn and TMG can be simultaneously introduced and when the molar fractions of (CH$_3$)$_2$Zn are $2\times10^{-7}$ and $10^{-8}$, respectively, the p-type carrier concentration becomes $5\times10^{19}$cm$^{-3}$ and $2\times10^{18}$cm$^{-3}$, respectively. The growth temperature was 550° C.

High-quality multi-quantum well lasers can be fabricated from the semiconductor having the structure as shown in FIG. 46. That is, since HCl is introduced immediately after the formation of a Ga surface, the surface defects and deep levels can be decreased. As a result, the yield is improved and lasers having a high degree of laser beam emitting efficiency can be fabricated. Furthermore, the hetero-interface is distinctly defined and the defects in the interface are reduced. Moreover, since a crystal is grown at a relatively low temperature of 550° C., the diffusion of Si and Zn can be satisfactorily suppressed. The defect-free and compositionally well-defined interface as well as a high light-emitting efficiency serve to lower the oscillation threshold current of the multi-quantum-well laser.

In EXAMPLES 11-16, trimethyl gallium was used as a source gas of Ga, but it is understood that when triethyl gallium (C$_2$H$_5$)$_3$Ga is used, the intrusion of carbon atoms into a crystal can be further reduced. Furthermore, instead of hydrogen chloride, hydrogen halide such as hydrogen bromide or hydrogen fluoride may be used.

As described above, according to the present invention a small quantity of hydride containing an element in Group V or VI is always forced to flow through the process chamber, vacancies produced by the desorption of an element in Group V or VI such as As are very small. In addition, the hydrogen gas is also forced to flow normally so that freed methyl radicals are reduced by hydrogen to become methane so that they are prevented from being trapped in a layer being grown and the carbon acceptors are decreased in number, whereby a grown layer having a high degree of purity can be obtained. These effects can be further enhanced when a compound containing ethyl radicals is used as an organometallic compound.

According to the present invention, a portion such as a Ga-Ga two-layer structure above a single atomic layer formed during the growth of a surface of an element in Group III or II can be easily desorbed in the form of a halide having a high vapor pressure when a hydrogen halide is introduced. As a result, surface defects and deep levels are remarkably decreased so that a perfect crystal can be obtained. Moreover, as compared with the conventional MLE and ALE methods, the growth rate is fast and the time period required for growing a crystal is satisfactorily acceptable in practice.

The sources gases are alternately introduced so that no additional compounds such as TMG, AsH3 and the like having a high decomposition temperature are produced so that the present invention has a unique feature that the crystal growth temperature can be essentially maintained at a relatively low level. That is, according to the present invention, thin films can be grown at relatively low temperatures below 600° C. so that the thermal diffusion into another layer can be substantially reduced to a minimum and an extremely well defined hetero-structure can be obtained.

The hetero-interface of a hetero-structure compound semiconductor formed by the method of the present invention is free from any projections and recesses so that the quantum well light is emitted from a single quantum level and consequently the half-width can be reduced. Furthermore, when electrons flow along the heterointerface, they are prevented from being scattered due to the surface roughness thereof.

In addition, according to the present invention, it becomes possible to easily grow an ordered mixed crystal.

According to the present invention, it becomes possible to uniformly grow a compound semiconductor over a relatively wide surface (more specifically, over the whole surface of a wafer greater than two inches) of a substrate and the non-uniformity in film thickness is less than ±1%. Furthermore, according to the present invention, it becomes possible to form not only hetero-structure compound semiconductors having an atomically uniform hetero-interface but also compound semiconductors in the form of a regular mixed crystal. Thus, the present invention can be applied to various fields such as the fabrication of FETs and laser elements.

Further, according to the present invention the high-concentration doping of III-V compound semiconductors becomes possible. Doping is effected during the crystal growth at low temperatures so that the diffusion of dopants in the interface between the doped layer and the non-doped layer can be reduced. Moreover, during the process of growing a crystal it is possible to use a method for introducing a hydrogen halide after the growth of an atomic surface of an element in Group III, thereby eliminating the surface defects and deep levels so that a crystal almost free from any defect can be obtained. Therefore, the method of the present invention is very advantageous in the fabrication of high-speed FETs and multi-quantum-well lasers using III-V compound semiconductors.

What is claimed is:

1. A process for preparing compound semiconductor thin films in which an organometallic compound cotaining an element of Group III or II and a hydride containing an element of Group V or VI are transported over a heated substrate and are subjected to thermal decomposition, whereby a III-V or II-VI compound semiconductor is grown over said heated substrate, the process comprising:

repeating a cycle consisting of the following steps, whereby a III-V or II-VI compound semiconductor is grown over said heated substrate by forming alternating layers of an element of Group III or II and an element of Group V or VI, respectively:

(a) introducing over said heated substrate a carrier gas comprising a hydride containing an element of Group V or VI and present in a first concentration, said carrier gas further comprising at least one organometallic compound containing an element of Group III or II and present in a concentration, to thermally decompose the organometallic compound and form a layer of at least one element of Group III or II, wherein said first concentration of said hydride is a molar fraction ranging from a value which corresponds to the equilibrium molar fraction of said element of Group V or VI on said III-V or II-VI compound semiconductor at the temperature of said heated substrate up to a value at which said element of Group V or VI is not substantially incorporated into said layer of at least one element of Group III or II;

(b) interrupting the introduction of said organometallic compound;

(c) introducing over said heated substrate a carrier gas comprising a hydride containing an element of Group V or VI and present in a second concentration, which second concentration is higher in hydride than said first concentration, to thermally decompose the hydride and form a layer of an element of Group V or VI on top of said layer of an element of Group III or II; and (d) interrupting the introduction of said hydride at said second concentration.

2. The process as claimed in claim 1, wherein the temperature of said heated substrate is between 430° C. and 520° C.

3. The process as claimed in claim 1, wherein said carrier gas is hydrogen.

4. The process as claimed in claim 1, wherein said first concentration of said hydride in step (a) is a molar fraction ranging from a value which corresponds to the equilibrium molar fraction of said element of Group V or VI on said III-V or II-VI compound semiconductor at the temperature of said heated substrate up to $4 \times 10^{-5}$.

5. The process as claimed in claim 1, wherein said second concentration of said hydride in step (c) is a molar fraction of greater than $1 \times 10^{-3}$.

6. The process as claimed in claim 1, wherein the concentration of said at least organometallic compound in step (a) is a molar fraction of greater than $1 \times 10^{-4}$.

7. The process as claimed in claim 1, wherein two kinds of organometallic compounds containing different Group III or II elements are introduced in step (a).

8. The process as claimed in claim 1, wherein said at least one organometallic compound contains ethyl radicals.

9. A process for preparing compound semiconductor thin films in which an organometallic compound containing an element of Group III or II and a hydride containing an element of Group V or VI are introduced over a heated substrate and are subjected to thermal decomposition, whereby a III-V or II-VI compound semiconductor is grown over said heated substrate, the process comprising:
repeating a cycle consisting of the following steps, whereby a III-V or II-VI compound semiconductor is grown over said heated substrate by forming alternating layers of an element of Group III or II and an element of Group V or VI, respectively:
(a) introducing over said heated substrate a first carrier gas comprising a hydride containing an element of Group V or VI and present in a first concentration, said first carrier gas further comprising at least one organometallic compound containing an element of Group III or II and present in a concentration, to thermally decompose the organometallic compound and form a layer of at least one element of Group III or II, wherein said first concentration of said hydride is a molar fraction ranging from a value which corresponds to the equilibrium molar fraction of said element of Group V or VI on said III-V or II-VI compound semiconductor at the temperature of said heated substrate up to a value at which said element of Group V or VI is not substantially incorporated into said layer of at least one element of Group III or II;
(b) interrupting the introduction of said organometallic compound; and
(c) introducing over said heated substrate a second carrier gas comprising a hydride containing an element of Group V or VI and present in a second concentration, which second concentration is higher in hydride than said first concentration, to thermally decompose the hydride and form a layer of an element of Group V or VI on top of said layer of at least one element of Group III or II; and
(d) interrupting the introduction of said hydride at said second concentration; and
(e) introducing over said heated substrate a third carrier gas comprising a hydrogen halide and present in halide which is diluted by a third carrier gas to a concentration of said hydrogen halide.

10. The process as claimed in claim 9, wherein said, second, and third carrier gases in steps (c) and (e) consist of hydrogen.

11. The process as claimed in claim 9, wherein said first concentration of said hydride in step (a) is a molar fraction ranging from a value which corresponds to the equilibrium molar fraction of said element of Group V or VI on said III-V or II-VI compound semiconductor at the temperature of said heated substrate up to $4 \times 10^{-5}$.

12. The process as claimed in claim 9, wherein said second concentration of said hydride in step (c) is a molar fraction of greater than $1 \times 10^{-3}$.

13. The process as claimed in claim 9, wherein the concentration of said at least one organometallic compound in step (a) is a molar fraction greater than $1 \times 10^{-4}$.

14. The process as claimed in claim 9, wherein the concentration of said hydrogen halide in step (e) is a molar fraction of greater than $1 \times 10^{-4}$.

15. The process as claimed in claim 9, wherein said hydrogen halide is hydrogen chloride.

16. The process as claimed in claim 9, wherein said heated substrate is mantained at a temperature higher than 400° C. but lower than 600° C.

17. The process as claimed in claim 9, wherein two kinds of organometallic compounds containing different Group III or II elements are introduced in step (a).

18. The process as claimed in claim 9, wherein said at least one organometallic compound contains ethyl radicals.

19. A process for preparing compound semiconductor thin films, comprising:
repeating a cycle consisting of the following steps, whereby a compound semiconductor which is an arsenide of a Group III or II element is grown over said heated substrate by forming alternating layers of at least one element of Group III or II and arsenic, respectively:
(a) introducing over said heated substrate a carrier gas comprising hydrogen and arsine (AsH$_3$) present in a first concentration, said carrier gas further comprising at least one organometallic compound containig an element of Group III or II and present in a concentration, to thermally decompose the organometallic compound and form a layer of at least one of Group III or II, wherein said first concentration of arsine is a molar fraction ranging from a value which corresponds to the equilibrium molar fraction of arsenic on said III-V or II-VI compound semiconductor at the temperature of said heated substrate up to a value at which said arsenic is not substantially incorporated into said layer of at least one element of Group III or II;
(b) interrupting the introduction of said organometallic compound;
(c) introducing said heated substrate a carrier gas comprising hydrogen and arsine (AsH$_3$) and present in a second concentration, which second concentration is higher in arsine (AsH$_3$) than said first concentration, to thermally decompose the arsine (AsH$_3$) and form a layer of arsenic on top of said layer of at least one element of Group III or II;
and introducing in any of steps (a) through (c), of said cycle silane (SiH$_4$), thereby doping said III-V or II-VI compound semiconductor.

20. A process for preparing compound semiconductor thin films, comprising:
repeating a cycle consisting of the following steps, whereby a III-V compound semiconductor is grown over said heated substrate by forming alternating layers of an element of Group III and an element of Group V, respectively:
(a) introducing over said heated substrate a carrier gas comprising hydrogen and a hydride containing an element of Group V and present in a first concentration, said carrier gas further comprising at least one organometallic compound containing an element of Group III and present in a concentration, to thermally decompose the organometallic compound and form a layer of at least one element of Group III, wherein said first concentration of said hydride is a molar fraction ranging from a value which corresponds to the equilibrium molar fraction of said element of Group V on said III-V compound semiconductor at the temperature of said heated substrate up to a value at which said element of Group V is not substantially incorporated into said layer of at least one element of Group III;

(b) interrupting the introduction of said organometallic compound;

(c) introducing on said heated substrate a carrier gas comprising hydrogen and a hydride containing an element of Group V and present in a second concentration, which second concentration is higher in hydride than said first concentration, to thermally decompose the hydride and form a layer of an element of Group V on top of said layer of at least one element of Group III;

(d) interrupting the introduction of said hydride at said second concentration;

(e) introducing over said heated substrate a hydrogen halide which is diluted by said hydrogen carrier gas;

(f) interrupting the introduction of said hydrogen halide; and (g) introducing over said heated substrate said carrier gas comprising hydrogen together with a compound containing an element in Group IV, VI or II, thereby doping said III-V compound semiconductor.

21. The process as claimed in claim 20, wherein said compound containing an element in Group IV, VI or II in step (g) is simultaneously introduced together with said at least one organometallic compound containing an element in Group III (a).

22. The process as claimed in claim 20, wherein said compound containing an element in Group IV, VI, or II in step (g) is introduced immediately after step (b).

23. The process as claimed in claim 20, wherein said compound containing an element in Group IV, VI or II in step (g) is introduced immediately after the interruption of the introduction of said hydride at said second concentration.

24. The process as claimed in claim 20, wherein said compound containing an element in Group IV, VI or II in step (g) is introduced during all of steps (a) through (f) of said cycle.

25. The process as claimed in claim 20, wherein said compound containing an element in Group IV, VI or II in step (g) and is silane (SiH$_4$).

26. The process as claimed in claim 25, wherein said silane has a molar fraction between $10^{-7}$ and $10^{-3}$.

* * * * *